United States Patent [19]

Kataoka

[11] Patent Number: 5,159,496
[45] Date of Patent: Oct. 27, 1992

[54] LENS SYSTEM WITH FOUR MENISCUS LENSES MADE OF ANOMALOUS DISPERSION GLASS

[75] Inventor: Yoshikazu Kataoka, Kyoto, Japan
[73] Assignee: Dainippon Screen Mfg. Co., Ltd., Japan
[21] Appl. No.: 673,794
[22] Filed: Mar. 22, 1991

[30] Foreign Application Priority Data

Apr. 4, 1990 [JP] Japan .................................. 2-90743

[51] Int. Cl.$^5$ ............................ G02B 9/64; G02B 9/62
[52] U.S. Cl. .................................. 359/754; 359/760; 359/761
[58] Field of Search ............... 350/425, 450, 464; 359/754, 760, 761, 679

[56] References Cited

U.S. PATENT DOCUMENTS

| | | | |
|---|---|---|---|
| 2,734,424 | 2/1956 | Bertele | 350/464 |
| 3,154,628 | 10/1964 | Bertele | 350/464 X |
| 3,567,310 | 3/1971 | Bertele | 350/464 |
| 3,630,600 | 12/1971 | Bertele | 350/464 |
| 3,700,312 | 10/1972 | Bertele | 350/464 |
| 4,359,269 | 11/1982 | Itoh | 350/425 |

Primary Examiner—Scott J. Sugarman
Attorney, Agent, or Firm—Ostrolenk, Faber, Gerb & Soffen

[57] ABSTRACT

A lens system operable with two or three colors comprises a front lens system disposed on the object side relative to a stop and a rear lens system disposed on the image side relative to the stop. The front lens system includes first to third lens groups, while the rear lens system includes fourth to sixth lens groups. Each of the front and rear lens systems includes two meniscus lenses. The meniscus lenses have a concave surface and a negative power. Accordingly, average image points with respect to two or three wavelengths substantially coincide with each other, while the image fields coincide with each other within the range from the vicinity of the optical axis to image peripheral portion.

17 Claims, 16 Drawing Sheets

SPHERICAL ABERRATION

ASTIGMATISM

SPHERICAL ABERRATION

ASTIGMATISM

SPHERICAL ABERRATION

ASTIGMATISM

SPHERICAL ABERRATION

ASTIGMATISM

SPHERICAL ABERRATION

ASTIGMATISM

SPHERICAL ABERRATION

ASTIGMATISM

SPHERICAL ABERRATION

ASTIGMATISM

DISTORTION (%)

SPHERICAL ABERRATION

ASTIGMATISM

DISTORTION (%)

SPHERICAL ABERRATION

ASTIGMATISM

DISTORTION (%)

SPHERICAL ABERRATION

ASTIGMATISM

DISTORTION (%)

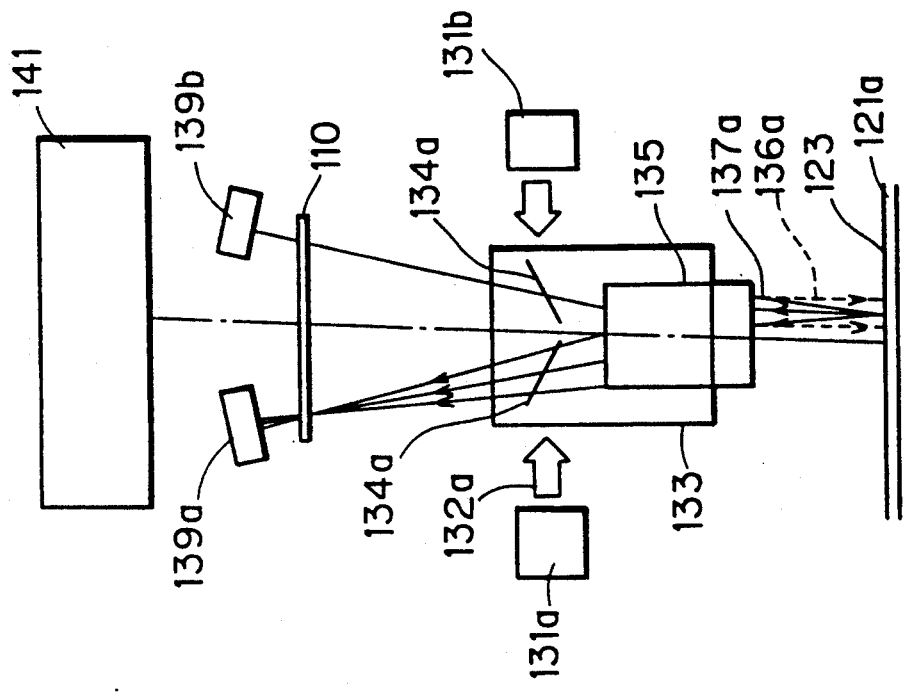
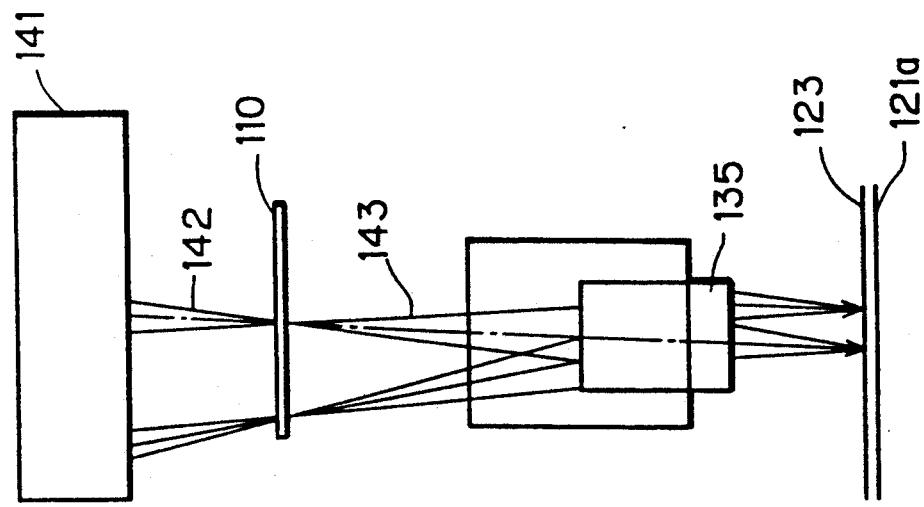

LENS SYSTEM WITH FOUR MENISCUS LENSES MADE OF ANOMALOUS DISPERSION GLASS

BACKGROUND OF THE INVENTION

1. Field of the Invention

The present invention relates to a lens system which is corrected for chromatic aberration with respect to two or three wavelengths. The system with two or three colors.

Description of the Background Art

Transferring patterns photo mask to a photoresist film is one of the processes in fabricating a semiconductor device The pattern transferring process includes: coating a semiconductor substrate with photoresist material: and illuminating with light the semiconductor substrate through a photomask having a predetermined mask pattern, to thereby expose the photoresist film. (The exposing step is referred to as "transfer treatment".) Normally, for production of a single semiconductor device, it is necessary to prepare various types of photomasks and to transfer the pattern for each photomask. In the transfer treatment, therefore, the photomask must be aligned so that the pattern of the photomask is matched with a pattern previously formed on the semiconductor substrate with a predetermined relationship. Conventionally the alignment has been carried out by visual observation through a microscope.

In general, photoresist material is highly sensitive to light with short wavelength but is not sensitive to light with a long wavelength. Accordingly, light with a long wavelength (for example, e-line) is used for the alignment, and light with a short wavelength (for example, g-line) is used for the transfer treatment.

For this reason, it is desired to use a lens system which is corrected for chromatic aberration with respect to two wavelengths, i.e., a long wavelength and a short wavelength A large number of lens systems which are corrected for chromatic aberration with respect to two wavelengths have been conventionally proposed.

In the prior art, however, there has been no lens system in which average image points with respect to the respective wavelengths substantially coincide with each other and wherein the image fields with respect to the respective wavelengths substantially coincide with each other within the range from the vicinity of an optical axis to the image peripheral portion. When, for example, the image fields with respect to the respective wavelengths are registered with each other in the vicinity of the optical axis while not being registered with each other in the image peripheral portion, the problem described below occurs. In the vicinity of the optical axis, the transfer treatment may be performed preferably without the adjustment of focus so long as the foucing operation is carried out in the alignment. In the image peripheral portion, on the contrary, the focal point in the alignment is deviated from that in the transfer treatment. Unless either the photomask or the semiconductor substrate moves along the optical axis in order to be in focus, therefore, the transfer treatment cannot be performed at a preferred resolution.

For reduction of exposure time and improvement in operating efficiency, it is preferable to use light having a plurality of rays wherein the wavelengths thereof are different from each other. For example, exposing of a photoresist film using the g- and h-lines is more favorable than exposing using only the g-line. In this case, for the transfer treatment with two different short wavelengths Such as the g- and h-lines, the lens system must be corrected for the chromatic aberration at least with respect to the g- and h-lines.

For eliminating the focusing operation in the alignment process and reducing the operating time for the transfer treatment, it is required to design a lens system which is corrected for chromatic aberration with respect to the long wavelength used in aligning and with respect to two different short wavelengths used in exposing. Furthermore, in order to transfer the whole image of the photomask to the photoresist film at a preferred resolution, it is required that the average image points with respect to the respective wavelengths substantially coincide with each other and that the image fields also coincide with each other within the range from the vicinity of the optical axis to the image peripheral portion. However, no lens system which meets these requirements has been heretofore proposed.

SUMMARY OF THE INVENTION

The present invention is directed to a lens system which is corrected for chromatic aberration with respect to two or three wavelengths. The lens system comprises: a stop; a front lens system, disposed to one side of the stop, comprising three lens groups which include two meniscus lenses, each the meniscus lens having a negative power, and a rear lens system, disposed to the other side of the stop, comprising three lens groups which include two meniscus lenses, each the meniscus lens having negative power, wherein each of the meniscus lenses having a concave surface directed to the stop respectively.

According to one aspect of the invention, the meniscus lenses are made of anomalous dispersion glass.

The present invention also relates a lens system for transferring an image of an object onto an image plane. The lens system comprises: a stop located between the object and the image plane; a front lens system, disposed between the object and the stop, comprising a first lens group, a second lens group and a third lens group, the first to the third lens groups being successively disposed in order from the object to the stop: and a rear lens system, disposed between the image plane and the stop, comprising a fourth lens group, a fifth lens group and a sixth lens group, the fourth to the sixth lens groups being successively disposed in order from the stop to the image plane, wherein the front lens system includes a first meniscus lens having a negative power and a second meniscus lens having a negative power, and the rear lens system includes a third meniscus lens having a negative power and a fourth meniscus lens having a negative power, each of the meniscus lenses having a concave surface directed to the stop respectively.

The first to the fourth meniscus lenses may be made of anomalous dispersion glass.

The present invention is also directed to an apparatus for reproducing a mask pattern of a photomask on a semiconductor device.

An object of the present invention is to provide a lens system in which average image points with respect to two or three wavelengths substantially coincide with each other.

Another object of the present invention is to be provide a lens system in which image fields with respect to the two or three wavelengths substantially coincide with each other within the range from the vicinity of an optical axis to an image peripheral portion.

A further object of the present invention is to provide an apparatus for transcribing a mask pattern in which a long wavelength can be used for the alignment and in which one or two short wavelengths can be used for the transfer treatment.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 12A and 12B are schematic diagram of an exposing apparatus employing the lens system according to the eleventh embodiment:

DESCRIPTION OF THE PREFERRED EMBODIMENTS

A. Lens System Dealing with Two Colors

A lens system must meet the following two requirements in order that average image points with respect to two different wavelengths coincide with each other: curve configurations indicative of spherical aberrations with respect to the respective wavelengths should be approximate to each other; and paraxial image points with respect to the respective wavelengths should coincide with each other.

In view of the above consideration, a modified Gauss type lens system is selected as a basic system for a lens system of the present invention. The modified Gauss type lens system comprises a front and a rear lens systems which are disposed symmetrically about a stop; that is, the front lens system, the stop and the rear lens system are disposed serially from an image side to an object side.

Figure 17:
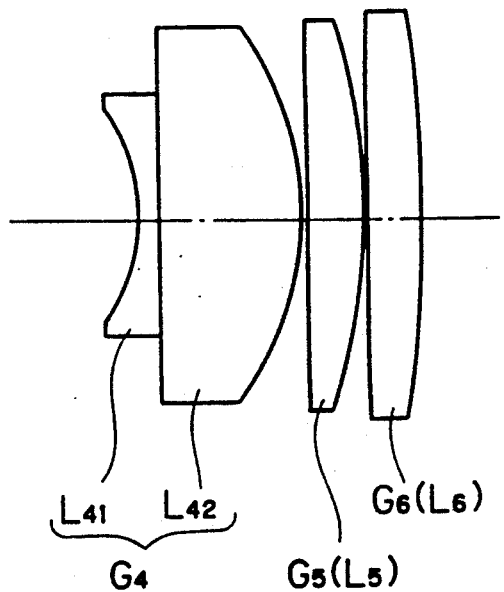
FIG. 17 shows an example of rear lens systems in a modified Gauss type lens system.

FIG. 17 is a diagram of an example according to the rear lens system of the modified Gauss type lens system. A rear lens system $20_R$ comprises three lens groups $G_4$ to $G_6$. The fourth lens group $G_4$ includes a lens $L_{41}$ having a negative power and a lens $L_{42}$ having a positive power, the fifth lens group $G_5$ includes a lens $L_5$ having a positive power, and the sixth lens group $G_6$ includes a lens $L_6$ having a positive power. In the rear lens system $20_r$, the lenses $L_{41}$, $L_{42}$, $L_5$ and $L_6$ are arranged serially from a stop side (the left-hand side of the figure) to the image side (the right-hand side of the figure). The front lens system includes a set of lens having completely the same configuration as the lenses $L_{41}$, $L_{42}$, $L_5$ and $L_6$ in the rear lens system $20_R$, the lenses of the front and the second lens system being approximately symmetrically disposed wit respect to the stop. The structure of the front lens system is easily understandable from FIG. 17, hence the illustration thereof is omitted.

According to the lens system constructed as above mentioned, chromatic aberration is corrected with respect to two different wavelengths (e.g., g- and h-lines), and the curve configurations indicative of the spherical aberrations with respect to the respective wavelengths are approximate to each other. However, curve configurations indicative of astigmatism with respect to the respective wavelengths differ largely from each other. This causes a large difference in astigmatism in image peripheral portion where the paraxial image points are in agreement with each other, resulting in deviation of image fields in the image peripheral portion.

In order to reduce the difference in astigmatism while utilizing the characteristic of the modified Gauss type lens system, a len system according to the present invention is structured as follows:

(A-1) First Preferred Embodiment

Figure 1A:
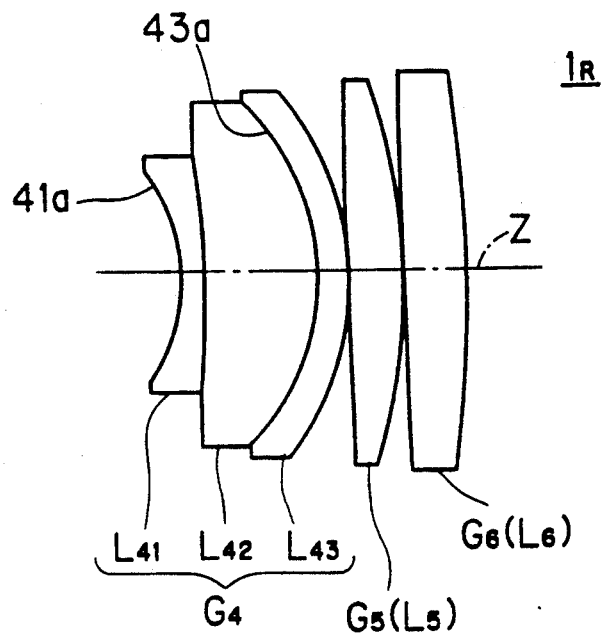
FIGS. 1A, 2A, 3A, 4A, 5A and 6A are diagrams of a rear lens system according to an embodiment of the present invention.

FIG. 1A is a diagram of a rear lens system of a first preferred embodiment according to the present invention. In FIG. 1A, the rear lens system $1_R$ comprises a fourth to a sixth lens group $G_4$ to $G_6$ arranged serially from a stop side (the left-hand side of the figure) to an image side (the right-hand side of the figure). The fourth lens group $G_4$ includes meniscus lenses $L_{41}$ and $L_{43}$ having a negative power and a lens $L_{42}$ having a positive power. The lenses $L_{41}$ and $L_{43}$ have concave surfaces $41a$ and $43a$ directed to the stop side, respectively. In the fourth lens group $G_4$, the lenses $L_{41}$ to $L_{43}$ are arranged serially from the stop side to the image side. The fifth and sixth lens groups $G_5$ and $G_6$ include lenses $L_5$ and $L_6$ having a positive power, respectively.

Table 1 shows lens data of the rear lens system $1_R$ constructed as above mentioned.

TABLE 1

| i | radius of curvature $r_i$ | distance $d_i$ | refractive index $n_g(i)$ | $n_h(i)$ |
|---|---|---|---|---|
| 1 | −26.100 | 3.00 | 1.64209 | 1.65073 |
| 2 | −193.500 | 16.00 | 1.63316 | 1.63779 |
| 3 | −33.000 | 4.00 | 1.64209 | 1.65073 |
| 4 | −39.400 | 0.20 | | |
| 5 | −900.000 | 7.00 | 1.72944 | 1.73545 |
| 6 | −117.000 | 0.20 | | |
| 7 | ∞ | 8.00 | 1.72944 | 1.73545 |
| 8 | −176.151 | | | |

In Table 1 (and Tables 2 to 11 described later), $r_i$ designates the radius of curvature of the i-th lens surface from the stop side (or an object side), and $d_i$ designates the distance on an optical axis Z between the i-th lens surface and the (i+1)-th lens surface from the stop side (or the object side), where the subscript i is an integer from one to eight. Further, in Table 1, $n_g(i)$ and $n_h(i)$ designate the refractive indices of the lenses $L_{41}$, $L_{42}$, $L_{43}$, $L_5$ and $L_6$ with respect to the g-line (435.83 nm) and the h-line (404.66 nm), respectively, where the subscript i is 1, 2, 3, 5 and 7.

A distance $d_O$ from the stop to the first lens surface (i.e., the concave surface 41a of the lens $L_{41}$) is 18.75. The focal length f of the rear lens system $1_R$ with respect to the g-line is 100.0, the effective F-number thereof is 6.3, and the total field angle (2θ) thereof is 40.6°.

Figure 1B:
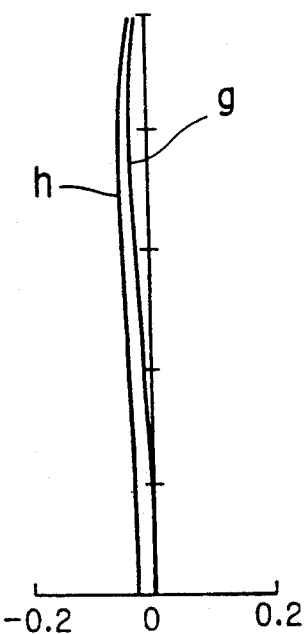
FIGS. 1B, 2B, 3B, 4B, 5B and 6B show spherical aberration of the rear lens system.
Figure 1C:
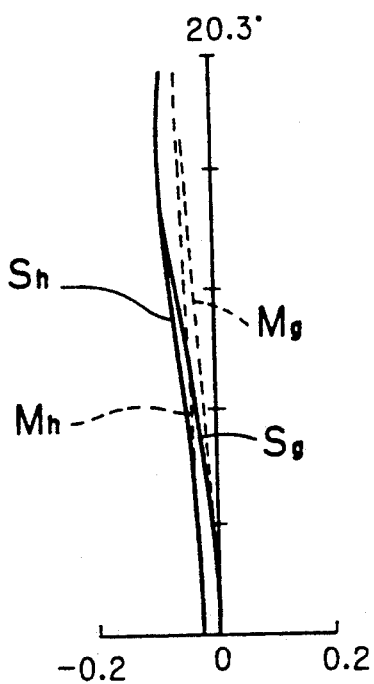
FIGS. 1C. 2C, 3C. 4C, 5C and 6C show the astigmatism of the rear lens system.

FIGS. 1B and 1C show the spherical aberration and astigmatism of the rear lens system $1_R$, respectively. In FIG. 1B (and in FIGS. 2B, 3B, 4B, 5B, 6B, 7B, 8B, 9B, 10B and 11B discussed later), reference characters g and h designate the spherical aberrations with respect to the g- and h-lines, respectively. In FIG. 1C (and FIGS. 2C, 3C, 4C, 5C, 6C, 7C, 8C, 9C, 10C and 11C discussed later), solid lines $S_g$ and $S_h$ designate the sagittal image fields with respect to the g- and h-lines, respectively, whereas dotted lines $M_g$ and $M_h$ designate the meridional image fields with respect to the g- and h-lines, respectively.

It is found from FIG. 1B that the respective spherical aberrations with respect to the g- and h-lines are small, that the curve configurations indicative thereof are approximate to each other, and that the average image points with respect to the g- and h-lines substantially coincide with each other, according to the rear lens system $1_R$. It is also found from FIG. 1C that the respective astigmatisms with respect to the g- and h-lines are small, that the curve configurations indicative thereof are substantially similar to eaoh other, and that the image fields substantially coincide with each other within the range from the vicinity of the optical axis to the image peripheral portion.

A front lens system, including a set of lenses having the same configuration as the lenses in the rear lens system $1_R$, is prepared, and then the front and rear lens systems are symmetrically disposed with respect to a stop, so that a lens system with a magnification of (−1) is formed. The front lens system has aberration characteristics similar to that of the rear lens system $1_R$ since the front lens system is identical to the rear lens system $1_R$ in structure. According to this lens system, therefore, the curve configurations indicative of the spherical aberrations with respect to the g- and h-lines are approximate to each other, and the average image points with respect to the g- and h-lines substantially coincide with each other. Furthermore, the curve configurations indicative of the astigmatisms with respect to the g- and h-lines are substantially similar to each other. Consequently, the image fields substantially coincide with each other within the range from the vicinity of the optical axis to the image peripheral portion with respect to the g- and h-lines.

(A-2) Second Preferred Embodiment

Figure 2A:
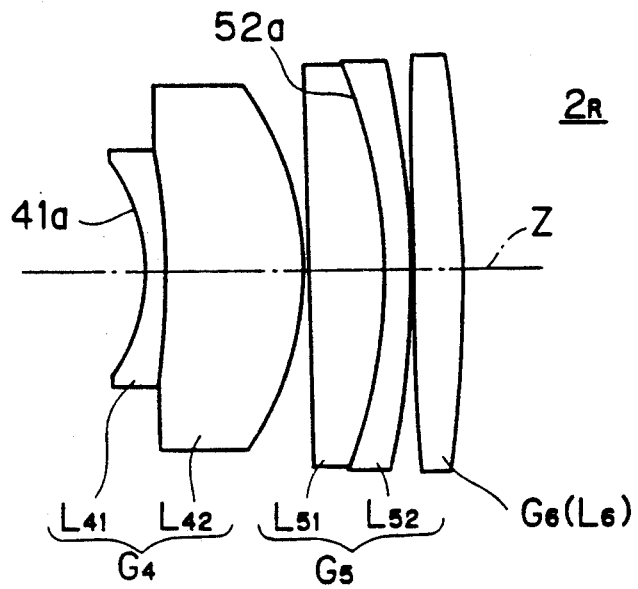

FIG. 2A shows a rear lens system of a second preferred embodiment according to the present invention. In FIG. 2A, the rear lens system $2_R$ comprises a fourth to a sixth lens group $G_4$ to $G_6$ arranged serially from a stop side (the left-hand side of the figure) to an image side (the right-hand side of the figure). The fourth lens group $G_4$ includes a meniscus lens $L_{41}$ having a negative power and a lens $L_{42}$ having a positive power, the lens $L_{41}$ having a concave surface 41a directed to the stop side. The lenses $L_{41}$ and $L_{42}$ are serially arranged from the stop side to the image side. The fifth lens group $G_5$ includes a lens $L_{51}$ having a positive power and a meniscus lens $L_{52}$ having a negative power, the lens $L_{52}$ having a concave surface 52a directed to the stop side. In the fifth lens group $G_5$, the lens $L_{51}$ and $L_{52}$ are also arranged in this order. The sixth lens group $G_6$ includes a lens $L_6$ having a positive power.

Table 2 shows lens data of the rear lens system $2_R$ constructed as above mentioned.

TABLE 2

| i | radius of curvature $r_i$ | distance $d_i$ | refractive index $n_g(i)$ | $n_h(i)$ |
|---|---|---|---|---|
| 1 | −26.200 | 3.00 | 1.64209 | 1.65073 |
| 2 | −109.600 | 19.00 | 1.63316 | 1.63779 |
| 3 | −39.310 | 0.20 | | |
| 4 | −885.000 | 10.00 | 1.72944 | 1.73545 |
| 5 | −69.000 | 4.00 | 1.64209 | 1.65073 |
| 6 | −118.000 | 0.20 | | |
| 7 | ∞ | 6.00 | 1.72944 | 1.73545 |
| 8 | −195.421 | | | |

In Table 2, $n_g(i)$ and $n_h(i)$ (i=1, 2, 4, 5 and 7) designate the refractive indices of the lenses $L_{41}$, $L_{42}$, $L_{51}$, $L_{52}$ and $L_6$ with respect to the g-line (435.83 nm) and the h-line (404.66 nm), respectively.

The distance $d_O$ is 19.25. The focal length f of the rear lens system $2_R$ with respect to the g-line is 100.0, the effective F-number thereof is 6.3, and the total field angle (2θ) thereof is 40.6°.

Figure 2B:
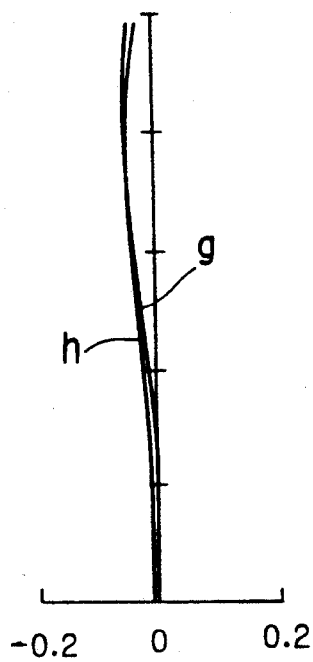
Figure 2C:
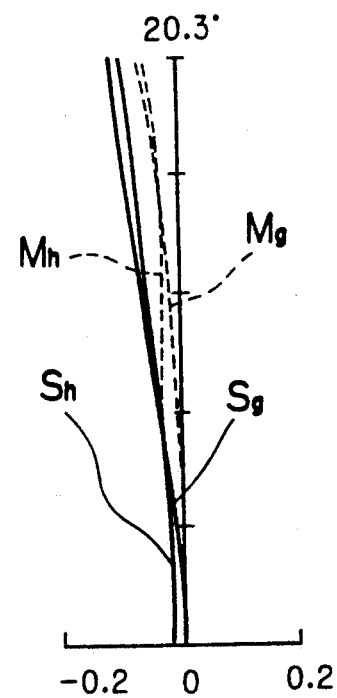

FIGS. 2B and 2C show the spherical aberration and astigmatism of the rear lens system $2_R$, respectively. It is found from FIG. 2B that the spherical aberrations with respect to the g- and h-lines are small, that the curve configurations indicative thereof are approximate to each other, and that the average image points with respect &o the g- and h-lines substantially coincide with each other, according to the rear lens system $2_R$. It is found from FIG. 2C that the astigmatisms with respect to the g- and h-lines are small, that the curve configurations indicative thereof are substantially similar to each other, and that the image fields with respect to the g- and h-lines substantially coincide with each other within the range from the vicinity of the optical axis to the image peripheral portion.

Similarly to the first preferred embodiment, a front lens system, including a set of lenses having the same configuration as the lenses in the rear lens system $2_R$, is prepared, and the front and rear lens systems are disposed symmetrically relative to the stop, so that a lens system with a magnification of (−1) is formed. For the same reason as the first preferred embodiment, the average image points with respect to the g- and h-lines substantially coincide with each other, and the image fields with respect to the g- and h-lines in the range from the vicinity of the optical axis to the image peripheral portion substantially coincide with eaoh other, according to this lens system.

(A-3) Third Preferred Embodiment

Figure 3A:
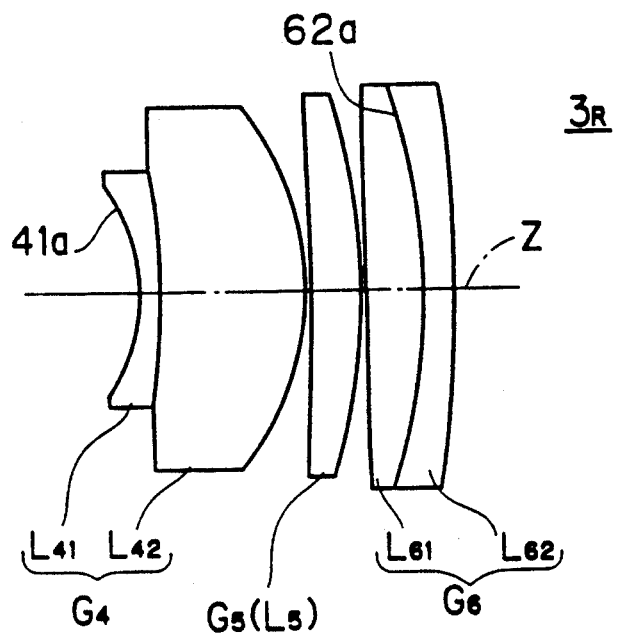

FIG. 3A is a diagram of a rear lens system of a third preferred embodiment according to the present invention. In FIG. 3A, the rear lens system $3_R$ comprises a fourth to a sixth lens groups $G_4$ to $G_6$ arranged serially from a stop side (the left-hand side of the figure) to an image side (the right-hand side of the figure). The fourth lens group $G_4$ includes a meniscus lens $L_{41}$ having a negative power and a lens $L_{42}$ having a positive power, the lens $L_{41}$ having a concave surface 41a directed to the stop side. The fifth lens group $G_5$ includes a lens $L_5$ having a positive power. The sixth lens group $G_6$ includes a lens $L_{61}$ having a positive power and a meniscus lens $L_{62}$ having a negative power, the lens $L_{62}$ having a concave surface 62a directed to the stop side.

In the rear lens system $3_R$, the lenses $L_{41}$, $L_{42}$, $L_5$, $L_{61}$ and $L_{62}$ are also arranged in this order.

Table 3 shows lens data of the rear lens system $3_R$ constructed as above mentioned.

TABLE 3

| i | radius of curvature $r_i$ | distance $d_i$ | refractive index $n_g(i)$ | $n_h(i)$ |
|---|---|---|---|---|
| 1 | −26.600 | 3.00 | 1.64209 | 1.65073 |
| 2 | −98.800 | 19.90 | 1.63316 | 1.63779 |
| 3 | −40.400 | 0.20 | | |
| 4 | −680.000 | 7.00 | 1.72944 | 1.73545 |
| 5 | −112.000 | 0.20 | | |
| 6 | ∞ | 8.00 | 1.72944 | 1.73545 |
| 7 | −84.000 | 4.00 | 1.64209 | 1.65073 |
| 8 | −197.113 | | | |

In Table 3, $n_g(i)$ and $n_h(i)$ (i = 1, 2, 4, 6 and 7) designate the refractive indices of the lenses $L_{41}$, $L_{42}$, $L_5$, $L_{61}$ and $L_{62}$ with respect to the g-line (435.83 nm) and the h-line (404.66 nm), respectively.

The distance $d_O$ is 18.60. The focal length f of the rear lens system $3_R$ with respect to the g-line is 100.0, the effective F-number thereof is 6.3, and the total field angle (2θ) thereof is 40.6°.

Figure 3B:
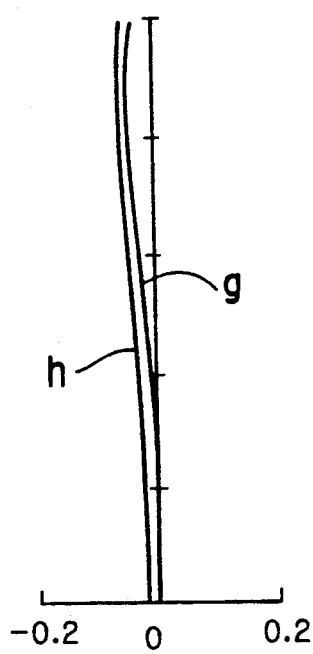
Figure 3C:
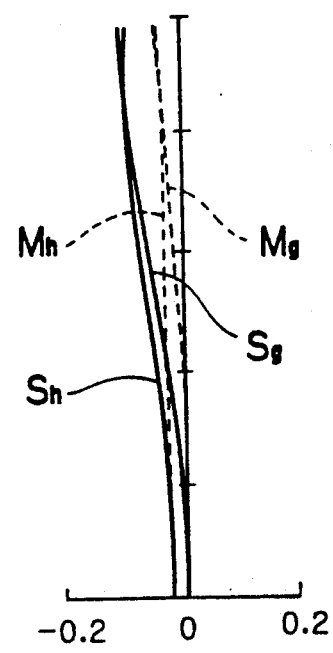

FIGS. 3B and 3C show the spherical aberration and astigmatism of the rear lens system $3_R$, respectively. It is found from FIG. 3B that the spherical aberrations with respect to the g- and h-lines are small, that the curve configurations indicative thereof are approximate to eaoh other, and that the average image points with respect to the g- and h-lines substantially coincide with each other, according to the rear lens system $3_R$. It is found from FIG. 3C that the astigmatisms with respect to the g- and h-lines are small, that the curve configurations indicative thereof are substantially similar to each other, and that the image fields with respect to the g- and h-lines in the range from the vicinity of the optical axis to the image peripheral portion substantially coincide with each other.

Similarly to the first and second preferred embodiments, a front lens system, including a set of lenses having the same configuration as the lenses in the rear lens system $3_R$, is prepared, and the front and rear lens systems are disposed symmetrically relative to the stop, so that an apochromatic lens system with −1x magnification is formed. For the same reason as the first and second preferred embodiments, the average image points with respect to the g- and h-lines substantially coincide with each other, and the image fields with respect to the g- and h- lines in the range from the vicinity of the optical axis to the image peripheral portion substantially coincide with each other, according to this lens system.

(A-4) Fourth Preferred Embodiment

Figure 4A:
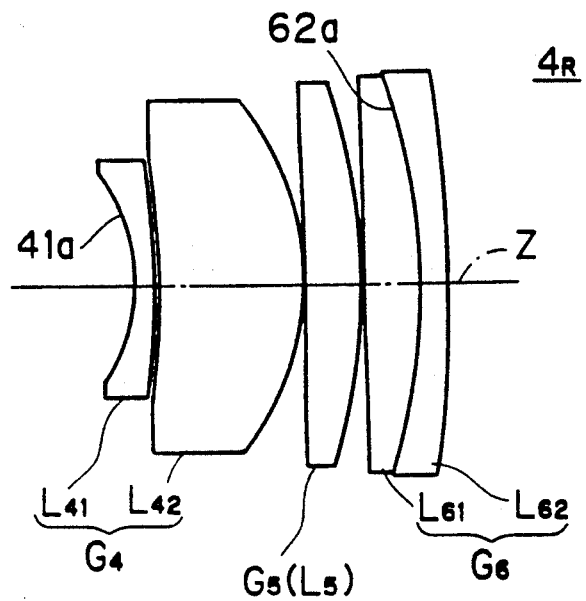

FIG. 4A is a diagram of a rear lens system of a fourth preferred embodiment according to the present invention. This rear lens system $4_R$ has the same structure as the lens system $3_R$ shown in FIG. 3A except that lenses $L_{41}$ and $L_{42}$ are spaced apart from each other in the rear lens system $4_R$ although the lenses $L_{41}$ and $L_{42}$ are attached to each other in the rear lens system $3_R$. Hence the description of the structure of the rear lens system $4_R$ is omitted.

Table 4 shows lens data of the rear lens system $4_R$.

TABLE 4

| i | radius of curvature $r_i$ | distance $d_i$ | refractive index $n_g(i)$ | $n_h(i)$ |
|---|---|---|---|---|
| 1 | −26.600 | 3.00 | 1.64209 | 1.65073 |
| 2 | −98.000 | 0.01 | | |
| 3 | −98.800 | 19.90 | 1.63316 | 1.63779 |
| 4 | −40.400 | 0.20 | | |
| 5 | −680.000 | 7.00 | 1.72944 | 1.73545 |
| 6 | −112.000 | 0.20 | | |
| 7 | ∞ | 8.00 | 1.72944 | 1.73545 |
| 8 | −84.000 | 4.00 | 1.64209 | 1.65073 |
| 9 | −198.894 | | | |

In Table 4, $n_g(i)$ and $n_h(i)$ (i = 1, 3, 5, 7 and 8) designate the refractive indices of the lenses $L_{41}$, $L_{42}$, $L_5$, $L_{61}$ and $L_{62}$ with respect to the g-line (435.83 nm) and the h-line (404.66 nm), respectively.

The distance $d_O$ is 18.42. The focal length f of the rear lens system $4_R$ with respect to the g-line is 100.0, the effective F-number thereof is 6.3, and the total field angle (2θk) thereof is 40.6°.

Figure 4B:
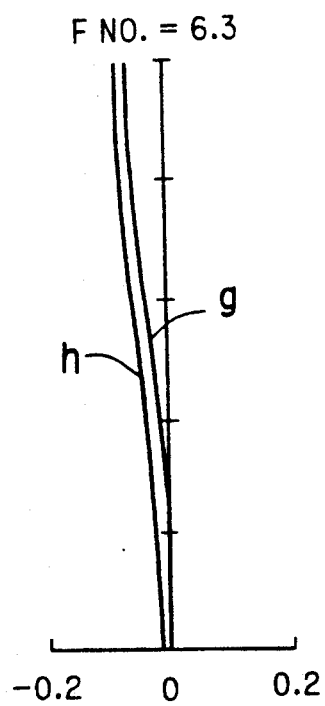
Figure 4C:
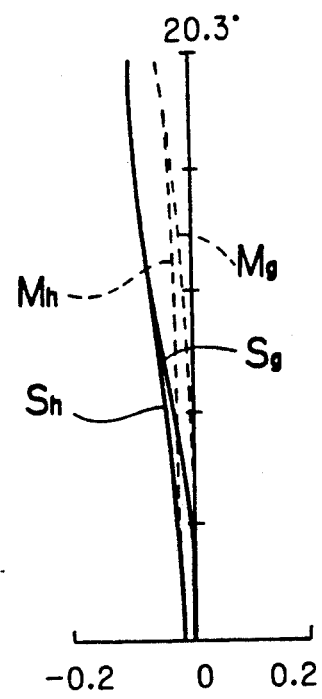

FIGS. 4B and 4C show spherical aberration and astigmatism of the rear lens system $4_R$, respectively. It is found from FIG. 4B that the spherical aberrations with respect to the g- and h-lines are small, that the curve configurations indicative thereof are approximate to eaoh other, and that the average image points with respect to the g- and h-lines substantially coincide with eaoh other, according to the rear lens system $4_R$. It is found from FIG. 4C that the astigmatisms with respect to the g- and h-lines are small, that the curve configurations indicative thereof are substantially similar to each other, and that the image fields with respect to the g- and h-lines in the range from the vicinity of the optical axis to the image peripheral portion substantially coincide with each other.

Similarly to the first to third preferred embodiments, a front lens system having the same structure as the rear lens system $4_R$ is prepared, and the front and rear lens systems are disposed symmetrically relative to the stop, so that lens system with −1x magnification is formed. For the same reason as the first to third preferred embodiments, the average image points with respect to the g- and h-lines substantially coincide with each other, and the image fields with respect to the g- and h-lines in the range from the vicinity of the optical axis to the image peripheral portion substantially coincide with eaoh other, according to this lens system.

(A-5) Fifth Preferred Embodiment

Figure 5A:
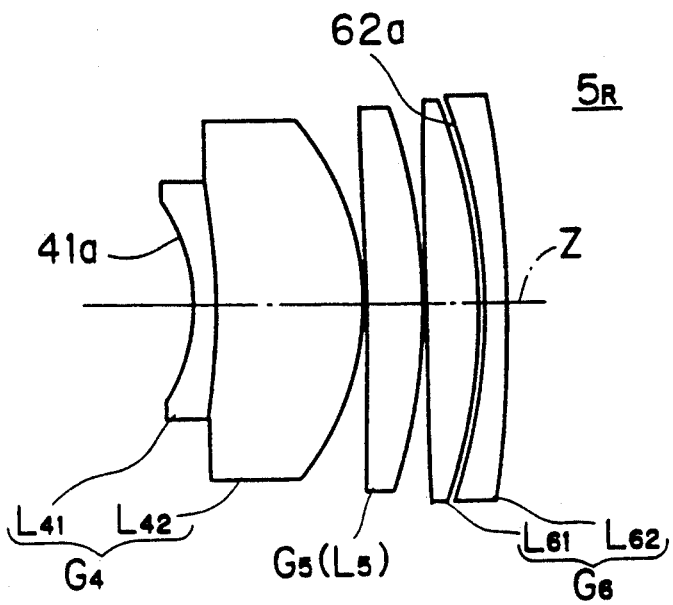

FIG. 5A is a diagram of a rear lens system of a fifth preferred embodiment according to the present invention. This rear lens system $5_R$ has the same structure as the lens system $3_R$ of FIG. 3A except that lenses $L_{61}$ and $L_{62}$ are spaced apart from each other in the rear lens system $5_R$ while the lenses $L_{61}$ and $L_{62}$ are attached to each other in the rear lens system $3_R$. Hence the description of the structure of the rear lens system $5_R$ is omitted.

Table 5 shows lens data of the rear lens system $5_R$.

TABLE 5

| i | radius of curvature $r_i$ | distance $d_i$ | refractive index $n_g(i)$ | $n_h(i)$ |
|---|---|---|---|---|
| 1 | −26.600 | 3.00 | 1.64209 | 1.65073 |
| 2 | −98.800 | 19.90 | 1.63316 | 1.63779 |
| 3 | −40.400 | 0.20 | | |
| 4 | −680.00 | 7.00 | 1.72944 | 1.73545 |
| 5 | −112.000 | 0.20 | | |

TABLE 5-continued

| i | radius of curvature $r_i$ | distance $d_i$ | refractive index $n_g(i)$ | $n_h(i)$ |
|---|---|---|---|---|
| 6 | ∞ | 8.00 | 1.72944 | 1.73545 |
| 7 | −84.000 | 0.01 | | |
| 8 | −84.000 | 4.00 | 1.64209 | 1.65073 |
| 9 | −197.145 | | | |

In Table 5, $n_g(i)$ and $n_h(i)$ (i=1, 2, 4, 6 and 8) designate the refractive indices of the lenses $L_{41}$, $L_{42}$, $L_5$, $L_{61}$ and $L_{62}$ with respect to the g-line (435.83 nm) and the h-line (404.66 nm), respectively.

Th distance $d_O$ is 18.60. The focal length f of the rear lens system $5_R$ with respect to the g-line is 100.0, the effective F-number thereof is 6.3, and the total field angle (2θ) thereof is 40.6°.

Figure 5B:
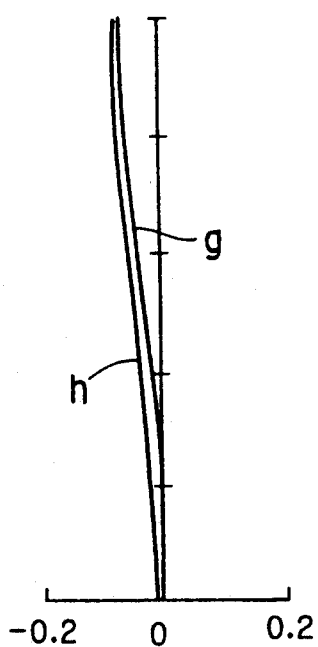
Figure 5C:
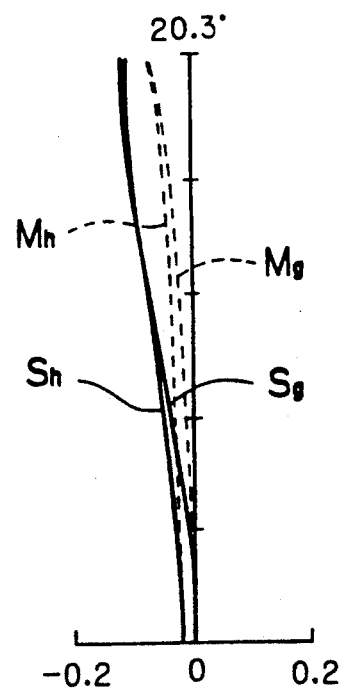

FIGS. 5B and 5C show spherical aberration and astigmatism of the rear lens system $5_R$, respectively. It is found from FIG. 5B that for the rear lens system $5_R$ the spherical aberrations with respect to the g- and h-lines are small, that the curve configurations indicative thereof are approximate to each other, and that the average image points with respect to the g- and h-lines substantially coincide with each other. FIG. 5C shows that the astigmatisms with respect to the g- and h-lines are small, that the curve configurations indicative thereof are substantially similar to each other, and that the image fields with respect to the g- and h-lines in &he range from the vicinity of the optical axis to the image peripheral portion substantially coincide with each other.

Similarly to the first to fourth preferred embodiments, a front lens system having the same structure as the rear lens system $5_R$ is prepared, and the front and rear lens systems are disposed symmetrically relative to the stop, so that a lens system with the magnification of (−1) is formed. For the same reason as the first to fourth preferred embodiments, the average image points with respect to the g- and h-lines substantially coincide with each other, and the image fields with respect to the g- and h-lines in the range from the vicinity of the optical axis to the image peripheral portion substantially coincide with each other, for this lens system.

(A-6) Sixth Preferred Embodiment

Figure 6A:
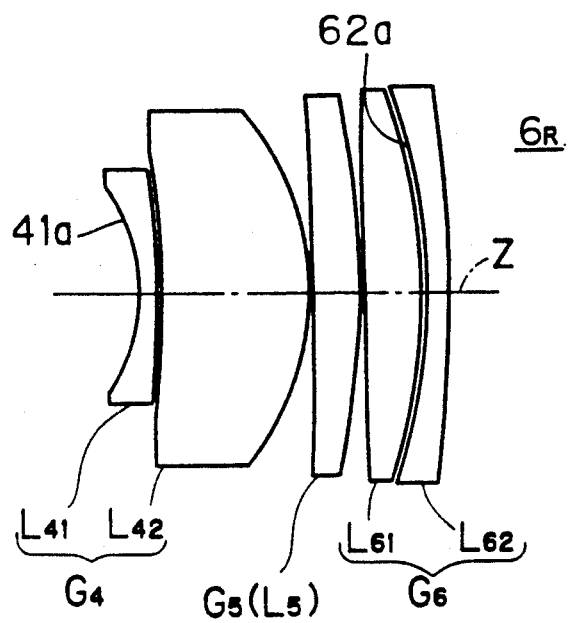

FIG. 6A is a diagram of a rear lens system of a sixth preferred embodiment according to the present invention. This rear lens system $6_R$ has the same structure as the lens system $3_R$ shown in FIG. 3A except that the lenses in each pair $L_{41}/L_{42}$ and $L_{61}/L_{62}$ are spaced apart from each other, while the lenses $L_{41}$ and $L_{42}$ and the lenses $L_{61}$ and $L_{62}$ are attached to each other in the rear lens system $3_R$. Hence the description of the structure of the rear lens system $6_R$ is omitted.

Table 6 shows lens data of the rear lens system $6_R$.

TABLE 6

| i | radius of curvature $r_i$ | distance $d_i$ | refractive index $n_g(i)$ | $n_h(i)$ |
|---|---|---|---|---|
| 1 | −26.600 | 3.00 | 1.64209 | 1.65073 |
| 2 | −98.000 | 0.01 | | |
| 3 | −98.800 | 19.90 | 1.63316 | 1.63779 |
| 4 | −40.400 | 0.20 | | |
| 5 | −680.000 | 7.00 | 1.72944 | 1.73545 |
| 6 | −112.000 | 0.20 | | |
| 7 | ∞ | 8.00 | 1.72944 | 1.73545 |
| 8 | −84.000 | 0.01 | | |
| 9 | −84.000 | 4.00 | 1.64209 | 1.65073 |

TABLE 6-continued

| i | radius of curvature $r_i$ | distance $d_i$ | refractive index $n_g(i)$ | $n_h(i)$ |
|---|---|---|---|---|
| 10 | −198.926 | | | |

In Table 6, $n_g(i)$ and $n_h(i)$ (i=1, 3, 5, 7 and 9) designate the refractive indices of the lenses $L_{41}$, $L_{42}$, $L_5$, $L_{61}$ and $L_{62}$ with respect to the line (435.83 nm) and the h-line (404.66 nm), respectively.

The distance $d_O$ is 18.41. The focal length f of the rear lens system $6_R$ with respect to the g-line is 100.0, the effective F-number thereof is 6.3, and the total field angle (2θ) thereof is 40.6°.

Figure 6B:
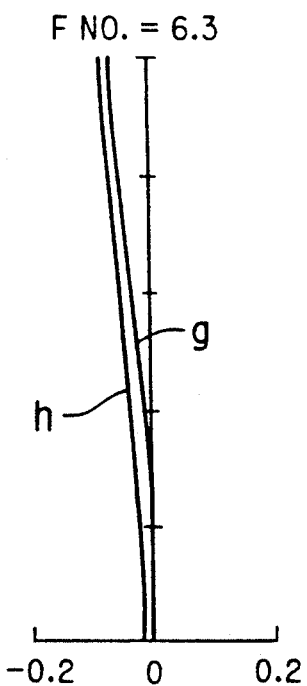
Figure 6C:
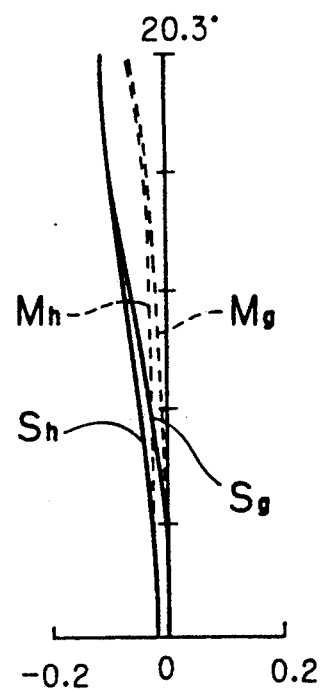

FIGS. 6B and 6C show spherical aberration and astigmatism of the rear lens system $6_R$, respectively. It is found from FIG. 6B for the rear lens system $6_R$ that the spherical aberrations with respect to the g- and h-lines are small, that the curve configurations indicative thereof are approximate to each other, and that the average image points with respect to the g- and h-lines substantially coincide with each other. It is found from FIG. 6C that the astigmatisms with respect to the g- and h-lines are small, that the curve configurations indicative thereof are substantially similar to each other, and that the image fields with respect to the g- and h-lines in the rang from the vicinity of the optical axis to the image peripheral portion substantially coincide with eaoh other.

Similarly to the first to fifth preferred embodiments, a front lens system having the same structure as the rear lens system $6_R$ is prepared, and the front and rear lens systems are disposed symmetrically relative to the stop, so that a lens system with −1x magnification is formed. For the same reason as the first to fifth preferred embodiments, the average image points with respect to the g- and h-lines substantially coincide with each other, and the image fields with respect to the g- and h-lines in the range from the vicinity of the optical axis to the image peripheral portion substantially coincide with each other, according to this lens system.

(A-7) Other Preferred Embodiments

In the first to sixth preferred embodiments, the front and the rear lens systems are identical to each other in structure, and the magnification of the lens system is set at −1x. However, the magnification of the lens system can be changed according to the appropriate combination of the front and the rear lens systems, for example, by disposing the lens systems having the structures of FIGS. 1A and 3A in face-to-face relation with the stop between. Similar effects can be attained by means of lens systems with a magnification of Mx constructed in this manner.

In the first to the sixth preferred embodiments, the correction for the chromatic aberration with respect to two wavelengths, i.e., the g-line and the h-line is carried out However, the combination of the two different wavelengths at which the correction for the chromatic aberration can be performed according to the preferred embodiments is not limited to the g- and h-lines. The correction for the chromatic aberration can be performed with respect to the combination of two arbitrary wavelengths.

B. Lens System Dealing with Three Colors

Lenses having negative powers are made of anomalous dispersion glass as described hereinafter, whereby the correction for chromatic aberration can be performed with respect to three different wavelengths.

(B-1 Seventh Preferred Embodiment)

Figure 7A:
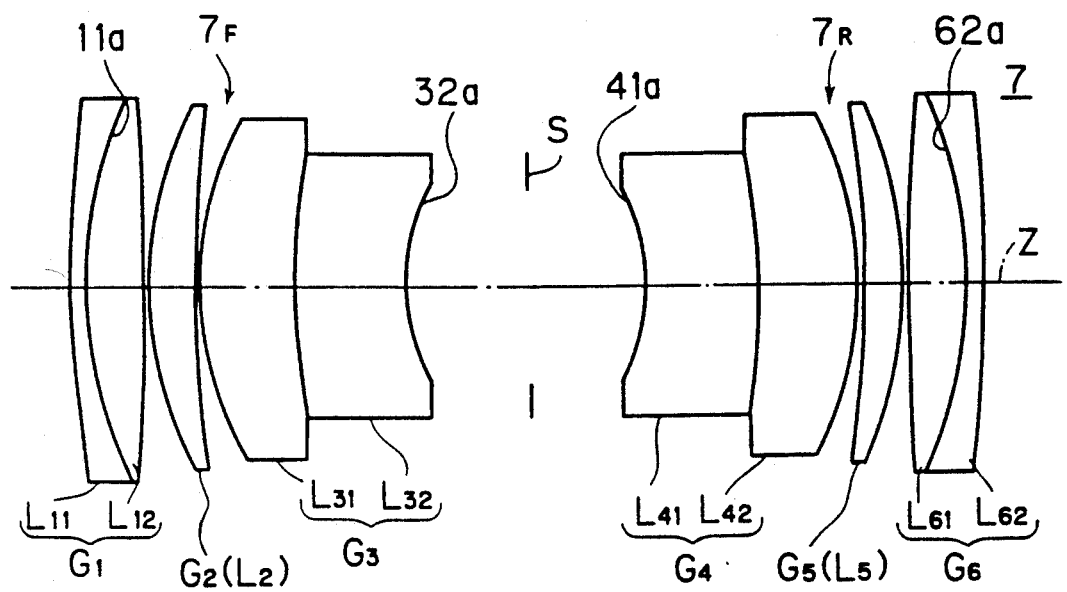
FIGS. 7A, 8A, 9A, 10A and 11A show an embodiment of the lens system according to the present invention.

FIG. 7A is a diagram of a seventh preferred embodiment of the lens system according to the present invention. The lens system 7 comprises a rear lens system $7_R$ having the same structure as the lens system $3_R$ of FIG. 3A and a front lens system $7_F$ having the same structure as the rear lens system $7_R$. The rear lens system $7_R$ is disposed on an image side (the right-hand side of the figure) while the front lens system $7_F$ disposed on an object side (the left-hand side of the figure) so that the front and the rear lens system $7_F$ and $7_R$ are symmetrical relative to a stop S.

The structure of the rear lens system $7_R$ is similar to that of the lens system $3_R$, and hence the description thereof is omitted.

The front lens system $7_F$ comprises a first to a third lens groups $G_1$ to $G_3$ arranged serially from the object side to a stop S side. The first lens group $G_1$ includes a meniscus lens $L_{11}$ having a negative power and a lens $L_{12}$ having a positive power, the lens $L_{11}$ having a concave surface 11a directed to the stop S side. The lenses $L_{11}$ and $L_{12}$ are arranged serially from the object side to the stop S side. The second lens group $G_2$ includes a lens $L_2$ having a positive power. The third lens group $G_3$ includes a lens $L_{31}$ having a positive power and a meniscus lens $L_{32}$ having a negative power, the lens $L_{32}$ having a concave surface 32a directed to the stop S side. The lenses $L_{31}$ and $L_{32}$ are arranged serially from the object side to the stop S side.

Table 7 shows lens data of the lens system 7 constructed as above mentioned.

TABLE 7

| i | radius of curvature $r_i$ | distance $d_i$ | $n_h(i)$ | $n_g(i)$ | $n_i(i)$ |
|---|---|---|---|---|---|
| 1 | 123.600 | 1.40 | 1.54695 | 1.54222 | 1.55516 |
| 2 | 42.940 | 5.90 | 1.50720 | 1.50450 | 1.51173 |
| 3 | −505.880 | 0.10 | | | |
| 4 | 39.410 | 4.77 | 1.50720 | 1.50450 | 1.51173 |
| 5 | 149.400 | 0.10 | | | |
| 6 | 39.060 | 10.00 | 1.58258 | 1.57899 | 1.58864 |
| 7 | 105.880 | 10.00 | 1.54695 | 1.54222 | 1.55516 |
| 8 | 19.410 | 23.52 | | | |
| 9 | −19.410 | 10.00 | 1.54695 | 1.54222 | 1.55516 |
| 10 | −105.880 | 10.00 | 1.58258 | 1.57899 | 1.58864 |
| 11 | −39.060 | 0.10 | | | |
| 12 | −149.400 | 4.77 | 1.50720 | 1.50450 | 1.51173 |
| 13 | −39.410 | 0.10 | | | |
| 14 | 505.880 | 5.90 | 1.50720 | 1.50450 | 1.51173 |
| 15 | −42.940 | 1.40 | 1.54695 | 1.54222 | 1.55516 |
| 16 | −123.600 | | | | |

In Table 7, $n_g(i)$, $n_h(i)$ and $n_i(i)$ (i=1, 2, 4, 6, 7, 9, 10, 12, 14 and 15) designate the refractive indices of the lenses $L_{11}$, $L_{12}$, $L_2$, $L_{31}$, $L_{32}$, $L_{41}$, $L_{42}$, $L_5$, $L_{61}$ and $L_{62}$ with respect to the g-line (435.83 nm), the h-line (404.66 nm) and the i-line (365.01 nm), respectively.

As will be understood from Table 7, the meniscus lenses $L_{11}$, $L_{32}$, $L_{41}$ and $L_{62}$ each of which has the negative power are made of anomalous dispersion glass. The glass material of each lens can be specified based on a refractive indices. Furthermore, it is found from the designation of the glass material that anomalous dispersion degree of the glass material is large, that is, the glass material is the anomalous dispersion glass.

The focal length f of the lens system 7 with respect to the h-line is 100.0, the effective F-number thereof is 8.0, the total field angle (2θ) thereof is 16.8°, and the magnification thereof is −1x.

Figure 7B:
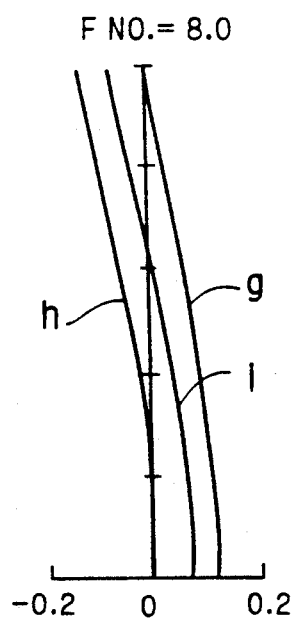
FIGS. 7B, 8B, 9B, 10B and 11B show the spherical aberration of the embodiment.
Figure 7C:
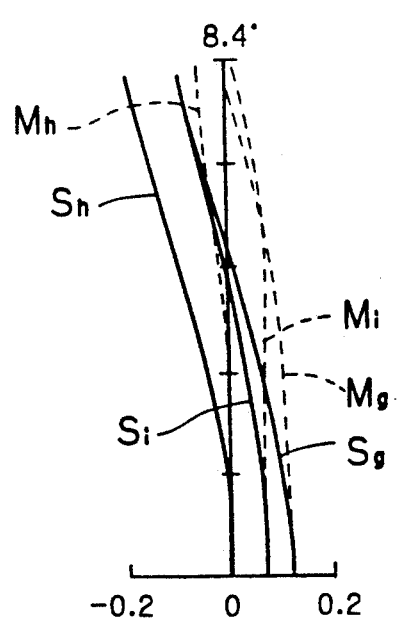
FIGS. 7C, 8C, 9C, 10C and 11C show the astigmatism of the embodiment; r
Figure 7D:
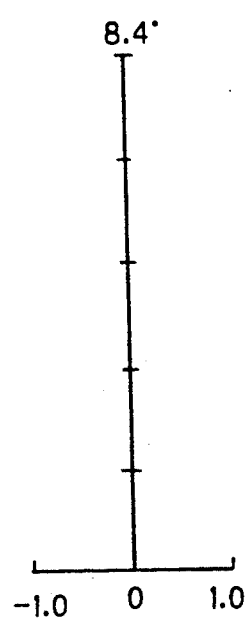
FIGS. 7D, 8D, 9D, 10D and 11D show the distortion of the embodiment.

FIGS. 7B, 7C and 7D show spherical aberration, astigmatism and distortion of the lens system 7, respectively. In FIG. 7B (and in FIGS. 8B and 10B discussed later), reference character i designates the spherical aberration with respect to the i-line. In FIG. 7C (and in FIGS. 8C and 10C discussed later), solid lines $S_i$ designate the sagittal image field with respect to the i-lines, and dotted line $M_i$ designate the meridional image field with respect to the i-line.

It is found from FIG. 7B that the spherical aberrations with respect to the g-, h- and i-lines are small, that the curve configurations indicative thereof are approximate to each other, and that the average image points with respect to the g-, h- and i-lines substantially coincide with each other, for the lens system 7. It is found from FIG. 7C that the astigmatisms with respect to the g-, h- and i-lines are small, that the curve configurations indicative thereof are substantially similar to each other, and that the image fields with respect to the g-, h- and i-lines substantially coincide with eaoh other within the rang from the vicinity of the optical axis to the image peripheral portion.

(B-2) Eighth Preferred Embodiment

Figure 8A:
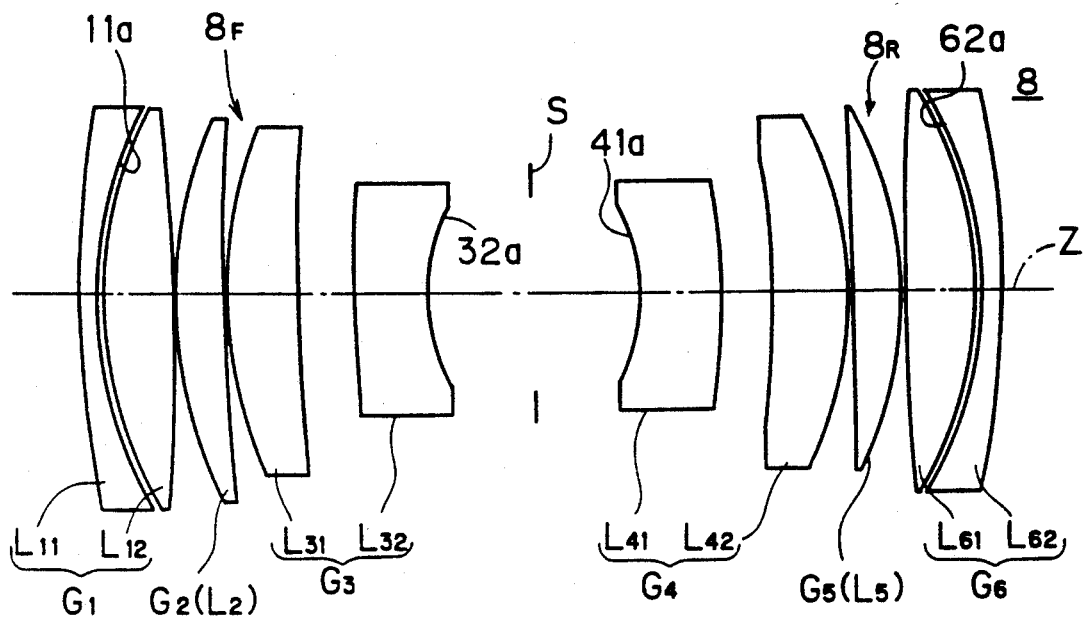

FIG. 8A is a diagram of an eighth preferred embodiment of a lens system according to the present invention. The lens system 8 comprises a rear lens system $8_R$ having the same structure as the lens system $6_R$ of FIG. 6A and a front lens system $8_F$ having the same structure as the rear lens system $8_R$. The rear lens system $8_R$ is disposed on an image side (the right-hand side of the figure) while the front lens system $8_F$ is disposed on an object side (the left-hand side of the figure) so that the both lens systems $8_F$ and $8_R$ are symmetrical relative to a stop S.

The structure of the rear lens system $8_R$ is similar to that of the lens system $6_R$, and hence the description thereof is omitted. Further, the structure of the front lens system $8_F$ is the same as the front lens system $7_F$ of FIG. 7A except that lenses $L_{11}$ and $L_{12}$ and lenses $L_{31}$ and $L_{32}$ are each spaced apart from each other while the corresponding lenses in the front lens system 7F are attached to each other. Thus, the description thereof is also omitted.

Table 8 shows lens data of the lens system 8.

TABLE 8

| i | radius of curvature $r_i$ | distance $d_i$ | $n_h(i)$ | $n_g(i)$ | $n_i(i)$ |
|---|---|---|---|---|---|
| 1 | 110.000 | 1.30 | 1.54695 | 1.54222 | 1.55516 |
| 2 | 37.000 | 0.50 | | | |
| 3 | 37.500 | 7.00 | 1.50720 | 1.50450 | 1.51173 |
| 4 | −390.000 | 0.10 | | | |
| 5 | 40.150 | 5.30 | 1.50720 | 1.50450 | 1.51173 |
| 6 | 440.000 | 0.10 | | | |
| 7 | 41.200 | 7.50 | 1.58258 | 1.57899 | 1.58864 |
| 8 | 150.000 | 5.00 | | | |
| 9 | 270.000 | 7.00 | 1.54695 | 1.54222 | 1.55516 |
| 10 | 19.250 | 20.80 | | | |
| 11 | −19.250 | 7.00 | 1.54695 | 1.54222 | 1.55516 |
| 12 | −270.000 | 5.00 | | | |
| 13 | −150.000 | 7.50 | 1.58258 | 1.57899 | 1.58864 |
| 14 | −41.200 | 0.10 | | | |
| 15 | −440.000 | 5.30 | 1.50720 | 1.50450 | 1.51173 |
| 16 | −40.150 | 0.10 | | | |
| 17 | 390.000 | 7.00 | 1.50720 | 1.50450 | 1.51173 |

TABLE 8-continued

| i | radius of curvature $r_i$ | distance $d_i$ | refractive index | | |
|---|---|---|---|---|---|
| | | | $n_h(i)$ | $n_g(i)$ | $n_i(i)$ |
| 18 | −37.500 | 0.50 | | | |
| 19 | −37.000 | 1.30 | 1.54695 | 1.54222 | 1.55516 |
| 20 | −110.000 | | | | |

In Table 8, $n_g(i)$, $n_h(i)$ and $n_i(i)$ (i=1, 3, 5, 7, 9, 11, 13, 15, 17 and 19) designate the refractive indices of the lenses $L_{11}$, $L_{12}$, $L_2$, $L_{31}$, $L_{32}$, $L_{41}$, $L_{42}$, $L_5$, $L_{61}$ and $L_{62}$ with respect to the g-line (435.83 nm), the h-line (404.66 nm) and the i-line (365.01 nm), respectively. The lenses $L_{11}$, $L_{32}$, $L_{41}$ and $L_{62}$ are formed of anomalous dispersion glass.

The focal length f of the lens system 8 with respect to the h-line is 100.0, the effective F-number thereof is 8.0, the total field angle (2θ) thereof is 16.8°, and the magnification thereof is −1x.

Figure 8B:
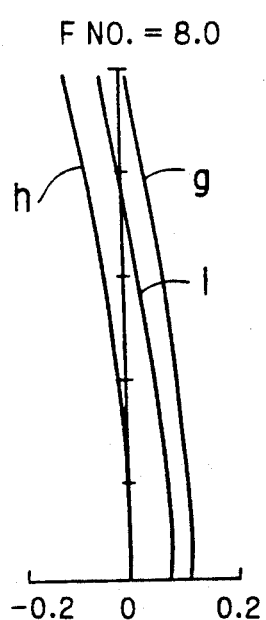
Figure 8C:
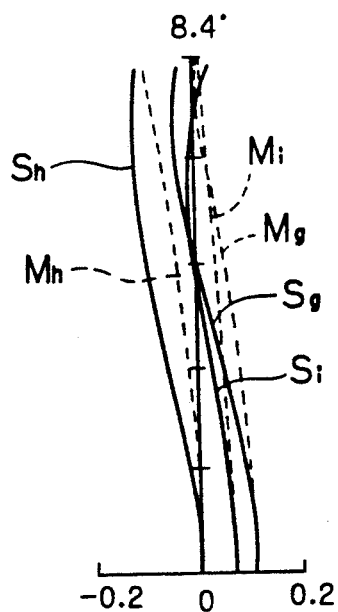
Figure 8D:
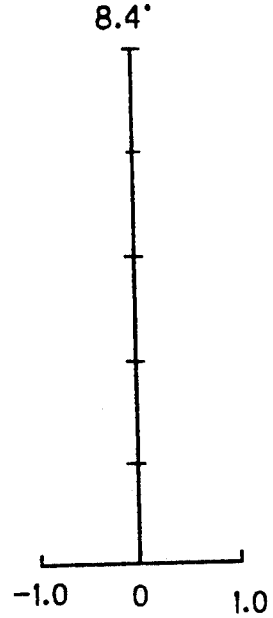

FIGS. 8B, 8C and 8D show spherical aberration, astigmatism and distortion of the lens system 8, respectively. It is found from FIG. 8B that the spherical aberrations with respect to the g-, h- and i-lines are small, that the curve configurations indicative thereof are approximate to each other, and that the average image points with respect to the g-, h- and i-lines substantially coincide with each other, for the lens system 8. It is found from FIG. 8C that the astigmatisms with respect to the g-, h- and i-lines are small, that the curve configurations indicative thereof are substantially similar to each other, and that the image fields with respect to the g-, h- and i-lines substantially coincide with each other within the range from the vicinity of the optical axis to the image peripheral portion.

(B-3) Ninth Preferred Embodiment

Figure 9A:
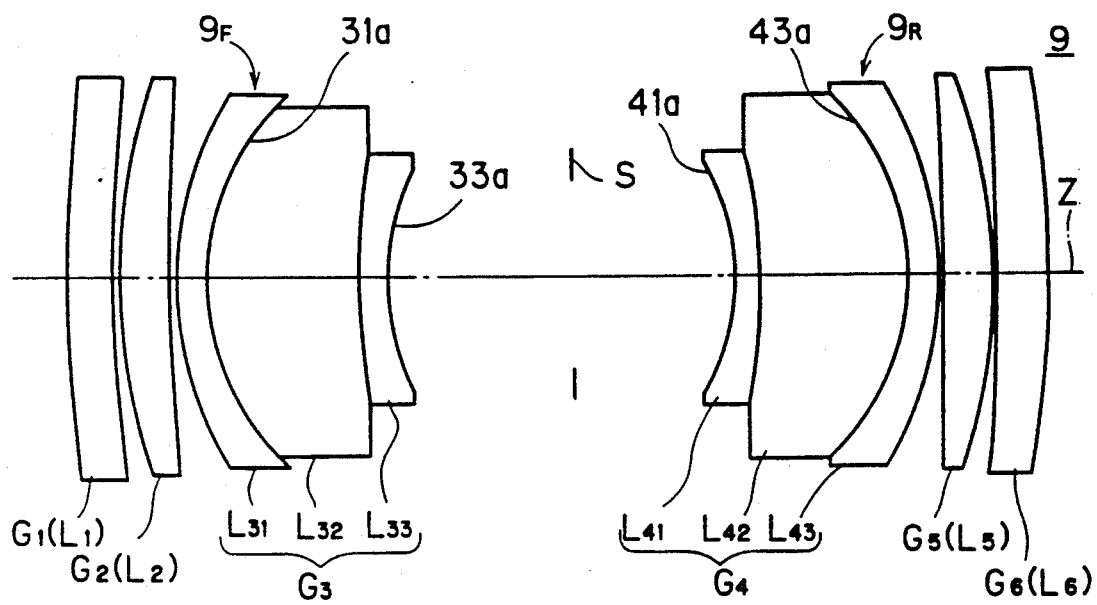

FIG. 9A is a diagram of a ninth preferred embodiment of a lens system according to the present invention. The lens system 9 comprises a rear lens system $9_R$ having the same structure as the lens system $1_R$ shown in FIG. 1A and a front lens system $9_F$ having the same structure as the rear lens system $9_R$. The rear lens system $9_R$ is disposed on an image side (the right-hand side of the figure) while the front lens system $9_F$ is disposed on an object side (the left-hand side of the figure) so that both lens systems 9F and 9R are symmetrical relative to a stop S.

The structure of the rear lens system $9_R$ is similar to that of the lens system $1_R$, and hence the description thereof is omitted.

The front lens system $9_F$ comprises a first to a third lens groups $G_1$ to $G_3$ arranged serially from the object side to a stop S side. The first and the second lens groups $G_1$ and $G_2$ include lenses $L_1$ and $L_2$ having a positive power, respectively. The third lens group $G_3$ includes meniscus lenses $L_{31}$ and $L_{33}$ having a positive power and a lens $L_{32}$ having a positive power, the lenses $L_{31}$ and $L_{33}$ having concave surfaces 31a and 33a directed to the stop side. In the lens group $G_3$, the lenses $L_{31}$ to $L_{33}$ are arranged serially from the object side to the stop S side.

Table 9 shows lens data of the lens system 9 constructed as above mentioned.

TABLE 9

| i | radius of curvature $r_i$ | distance $d_i$ | refractive index | | |
|---|---|---|---|---|---|
| | | | $n_g(i)$ | $n_e(i)$ | $n_h(i)$ |
| 1 | 164.850 | 4.22 | 1.50526 | 1.49926 | 1.50794 |
| 2 | 431.240 | 0.12 | | | |
| 3 | 58.500 | 4.22 | 1.50526 | 1.49926 | 1.50794 |
| 4 | 431.240 | 0.12 | | | |
| 5 | 30.220 | 2.41 | 1.56508 | 1.55379 | 1.57029 |
| 6 | 19.900 | 12.67 | 1.57899 | 1.57098 | 1.58258 |
| 7 | 105.550 | 1.80 | 1.54221 | 1.53187 | 1.54694 |
| 8 | 19.660 | 28.00 | | | |
| 9 | −19.660 | 1.80 | 1.54221 | 1.53187 | 1.54694 |
| 10 | −105.550 | 12.67 | 1.57899 | 1.57098 | 1.58258 |
| 11 | −19.900 | 2.41 | 1.56508 | 1.55379 | 1.57029 |
| 12 | −30.220 | 0.12 | | | |
| 13 | −431.240 | 4.22 | 1.50526 | 1.49926 | 1.50794 |
| 14 | −58.500 | 0.12 | | | |
| 15 | −431.240 | 4.22 | 1.50526 | 1.49926 | 1.50794 |
| 16 | −165.850 | | | | |

In Table 9, $n_g(i)$, $n_h(i)$ and $n_e(i)$ (i=1, 3, 5, 6, 7, 9, 10, 11, 13 and 15) designate the refractive indices of the lenses $L_1$, $L_2$, $L_{31}$, $L_{32}$, $L_{33}$, $L_{41}$, $L_{42}$, $L_{43}$, $L_5$ and $L_6$ with respect to the g-line (435.83 nm), the h-line (404.66 nm) and the e-line (546.07 nm), respectively. The lenses $L_{31}$, $L_{33}$, $L_{41}$ and $L_{43}$ each of which has a negative power are made of anomalous dispersion glass.

The focal length f of the lens system 9 with respect to the g-line is 100.0, the effective F-number thereof is 9.0, the total field angle (2θ) thereof is 17.0°, and the magnification thereof is −1x.

Figure 9B:
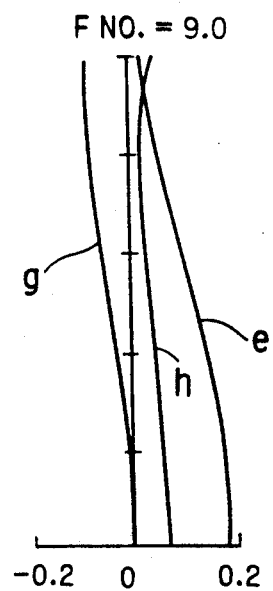
Figure 9C:
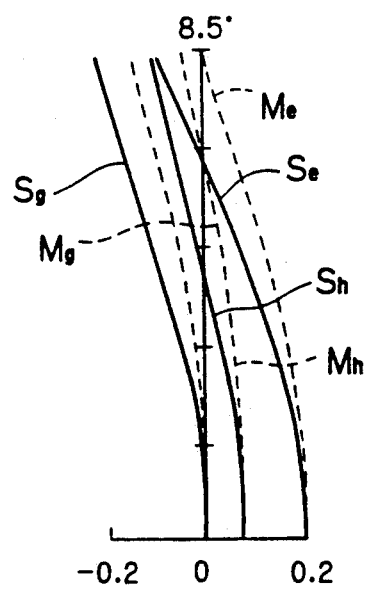
Figure 9D:
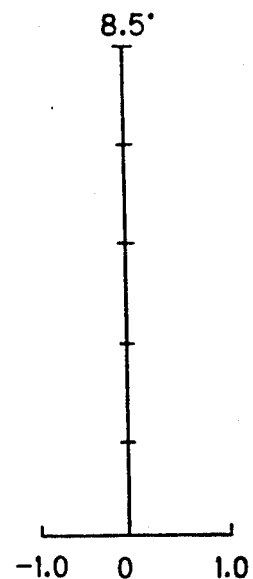

FIGS. 9B, 9C and 9D show spherical aberration, astigmatism and distortion of the lens system 9, respectively. In FIG. 9B (and FIG. 11B discussed later), reference character designates the spherical aberration with respect to the e-line. In FIG. 9C (and FIG. 11C discussed later), the solid line $S_e$ designates the sagirral image field with respect to the e-line, and the dotted line $M_e$ designates the meridional image field with respect to the e-line.

It is found from FIG. 9B that the spherical aberrations with respect to the g-, h- and e-lines are small, that the curve configurations indicative thereof are approximate to each other, and that the average image points with respect to the g-, h- and e-lines substantially coincide with each other, for the lens system 9. It is found from FIG. 9C that the astigmatisms with respect to the g-, h- and e-lines are small, that the curve configurations indicative thereof are substantially similar to each other, and that the image fields with respect to the g-, h- and e-lines substantially coincide with each other within the range from the vicinity of the optical axis to the image peripheral portion.

(B-4) Tenth Preferred Embodiment

Figure 10A:
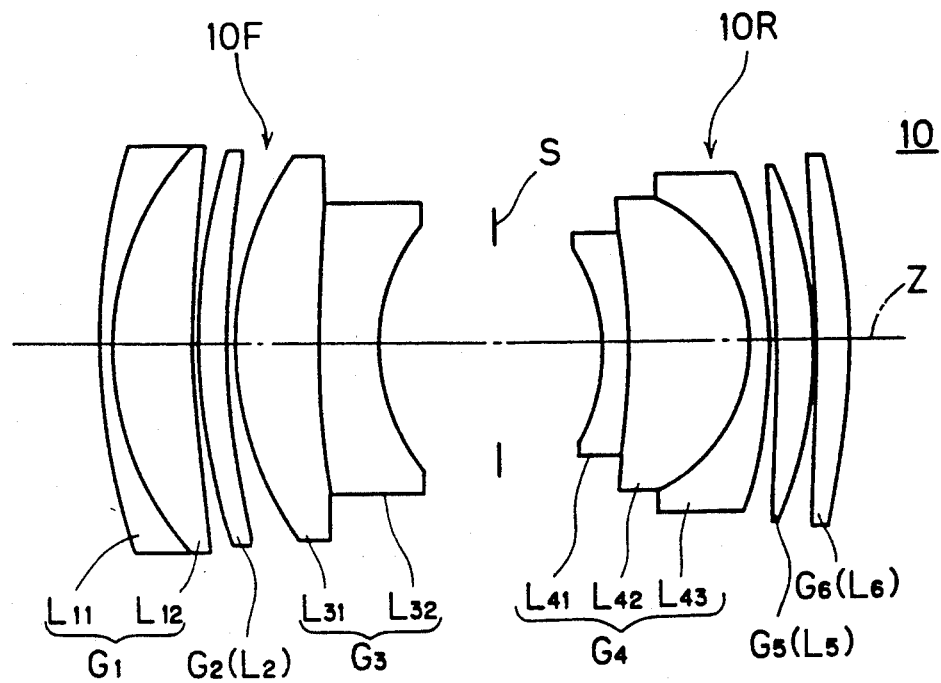

FIG. 10A shows a tenth preferred embodiment of a lens system according to the present invention. Unlike the seventh to the ninth preferred embodiments, a front and a rear lens systems $10_F$ and $10_R$ are not symmetrical in the lens system 10 of the tenth embodiment. The lens system 10 comprises the rear lens system $10_R$ having the same structure as the lens system $1_R$ of FIG. 1A and the front lens system $10_F$ having the same structure as the lens system $7_F$ of FIG. 7A. A stop S is provided between the rear lens system $10_R$ is disposed on an image side (the right-hand side of the figure) and the front lens system $10_F$ disposed on an object side (the left-hand side of the figure).

The structure of the rear lens system $10_R$ is similar to that of the lens system $1_R$, and hence the description thereof is omitted. The structure of the front lens system $10_F$ is similar to that of the lens system $7_F$, and hence the description thereof is omitted.

Table 10 shows lens data of the lens system 10.

TABLE 10

| i | radius of curvature $r_i$ | distance $d_i$ | refractive index | | |
|---|---|---|---|---|---|
| | | | $n_h(i)$ | $n_g(i)$ | $n_i(i)$ |
| 1 | 60.000 | 1.90 | 1.54697 | 1.54223 | 1.55516 |
| 2 | 34.700 | 8.50 | 1.58258 | 1.57899 | 1.58864 |
| 3 | 148.000 | 0.10 | | | |
| 4 | 57.000 | 4.10 | 1.58258 | 1.57899 | 1.58864 |
| 5 | 113.000 | 0.10 | | | |
| 6 | 38.700 | 10.00 | 1.58258 | 1.57899 | 1.58864 |
| 7 | 337.000 | 5.70 | 1.54697 | 1.54223 | 1.55516 |
| 8 | 21.000 | 24.10 | | | |
| 9 | −24.200 | 3.00 | 1.57114 | 1.56593 | 1.58019 |
| 10 | −53.400 | 13.00 | 1.58258 | 1.57899 | 1.58864 |
| 11 | −18.000 | 3.10 | 1.54697 | 1.54223 | 1.55516 |
| 12 | −45.200 | 0.10 | | | |
| 13 | −270.000 | 4.30 | 1.58258 | 1.57899 | 1.58864 |
| 14 | −56.700 | 0.10 | | | |
| 15 | −470.000 | 3.90 | 1.58258 | 1.57899 | 1.58864 |
| 16 | −97.000 | | | | |

In Table 10, $n_g(i)$, $n_h(i)$ and $n_i(i)$ (i=1, 2, 4, 6, 7, 9, 10, 11, 13 and 15) designate the refractive indices of the lenses $L_{11}$, $L_{12}$, $L_2$, $L_{31}$, $L_{41}$, $L_{42}$, $L_{43}$, $L_5$ and $L_6$ with respect to the g-line (435.83 nm), the h-line (404.66 nm) and the i-line (365.01 nm), respectively. The lenses $L_{11}$, $L_{32}$, $L_{41}$ and $L_{43}$ having a negative power and are formed of anomalous dispersion glass.

The focal length f of the lens system 10 with respect to the h-line is 100.0, the effective F number thereof is 5.6, the total field angle (2θ) thereof is 25.6°, and the magnification thereof is $-(\frac{1}{2})x$.

Figure 10B:
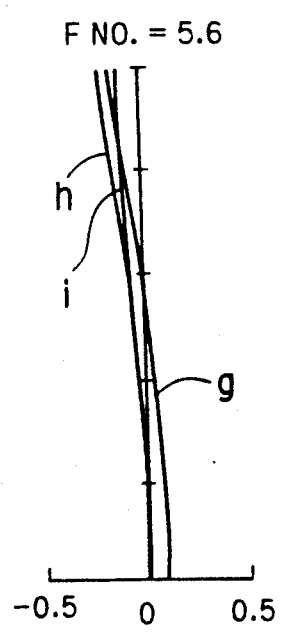
Figure 10C:
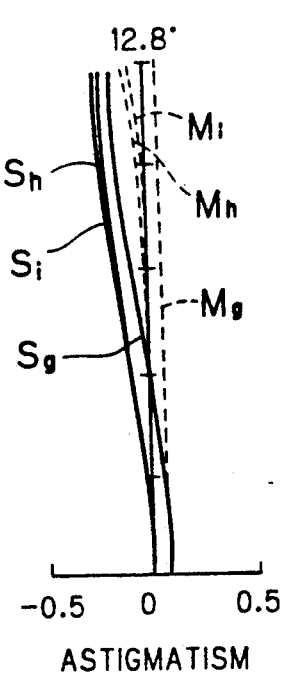
Figure 10D:
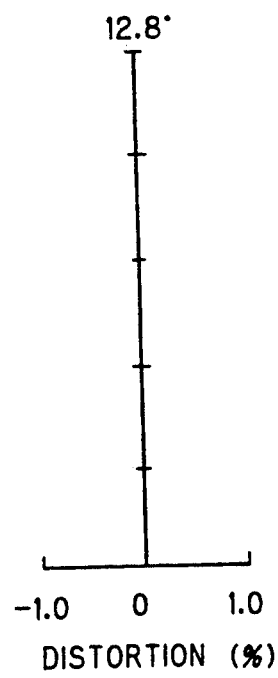

FIGS. 10B, 10C and 10D show spherical aberration, astigmatism and distortion of the lens system respectively. It is found from FIG. 10B that the spherical aberrations with respect to the g-, h- and i-lines are small, that the curve configurations indicative thereof are approximate to each other, and that the average image points with respect to the g-, h- and i-lines substantially coincide with eaoh other, for the lens system 10. It is found from FIG. 10C that the astigmatisms with respect to the g-, h- and i-lines are small, that the curve configurations indicative thereof are substantially similar to eaoh other, and that the image fields with respect to the g-, h- and i-lines substantially coincide with each other within the range from the vicinity of the optical axis to the image peripheral portion.

(B 5) Eleventh Preferred Embodiment

Figure 11A:
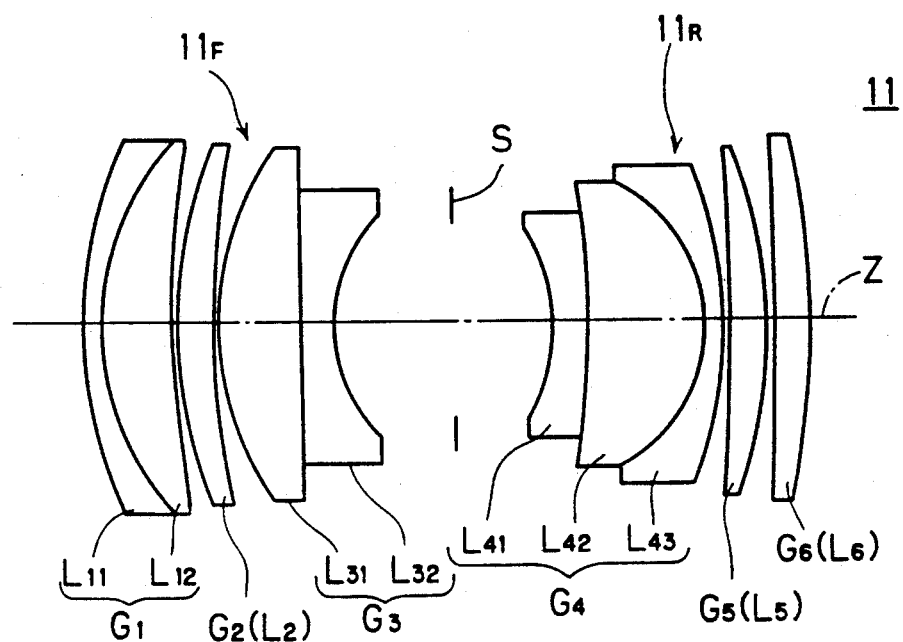

FIG. 11A shows an eleventh preferred embodiment of a lens system according to the present invention. The structure of the lens system II is similar to that of the lens system 10 of FIG. 10A, and hence the description thereof is omitted.

Table 11 shows lens data of the lens system 11.

TABLE 11

| i | radius of curvature $r_i$ | distance $d_i$ | refractive index | | |
|---|---|---|---|---|---|
| | | | $n_g(i)$ | $n_e(i)$ | $n_h(i)$ |
| 1 | 53.600 | 1.90 | 1.54221 | 1.53187 | 1.54694 |
| 2 | 32.300 | 7.80 | 1.57899 | 1.57098 | 1.58258 |
| 3 | 116.000 | 0.10 | | | |
| 4 | 55.600 | 4.70 | 1.57899 | 1.57098 | 1.58258 |
| 5 | 106.000 | 0.10 | | | |
| 6 | 36.000 | 9.50 | 1.57899 | 1.57098 | 1.58258 |
| 7 | 720.000 | 3.70 | 1.54221 | 1.53187 | 1.54694 |
| 8 | 20.400 | 24.00 | | | |
| 9 | −23.800 | 3.30 | 1.56508 | 1.55379 | 1.57029 |

TABLE 11-continued

| i | radius of curvature $r_i$ | distance $d_i$ | refractive index | | |
|---|---|---|---|---|---|
| | | | $n_g(i)$ | $n_e(i)$ | $n_h(i)$ |
| 10 | −86.000 | 13.00 | 1.57899 | 1.57098 | 1.58258 |
| 11 | −18.400 | 2.80 | 1.54221 | 1.53187 | 1.54694 |
| 12 | −43.800 | 0.10 | | | |
| 13 | −260.000 | 4.60 | 1.57899 | 1.57098 | 1.58258 |
| 14 | −58.300 | 0.10 | | | |
| 15 | −261.000 | 3.70 | 1.57899 | 1.57098 | 1.58258 |
| 16 | −86.600 | | | | |

In Table 11, $n_g(i)$, $n_h(i)$ and $n_e(i)$ (i=1, 2, 4, 6, 7, 9, 10, 11, 13 and 15) designate the refractive indices of the lenses $L_{11}$, $L_{12}$, $L_2$, $L_{31}$, $L_{32}$, $L_{41}$, $L_{42}$, $L_{43}$, $L_5$ and $L_6$ with respect to the g-line (435.83 nm), the h-line (404.66 nm) and the e-line (546.07 nm), respectively. The lenses $L_{11}$, $L_{32}$, $L_{41}$ and $L_{43}$ having a negative power and are formed of anomalous dispersion glass.

The focal length f of the lens system 11 with respect to the g-line is the effective F-number thereof is 5.6, the total field angle (2θ) thereof is 26.0°, and the magnification thereof is $-(\frac{1}{2})x$.

Figure 11B:
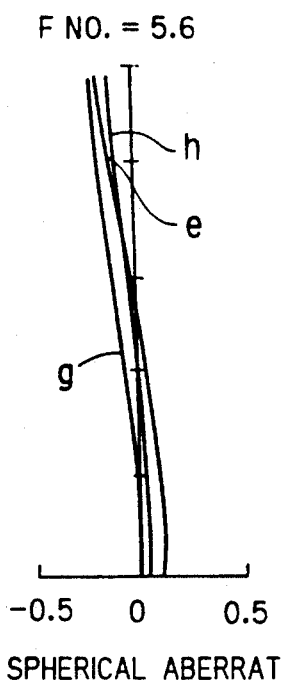
Figure 11C:
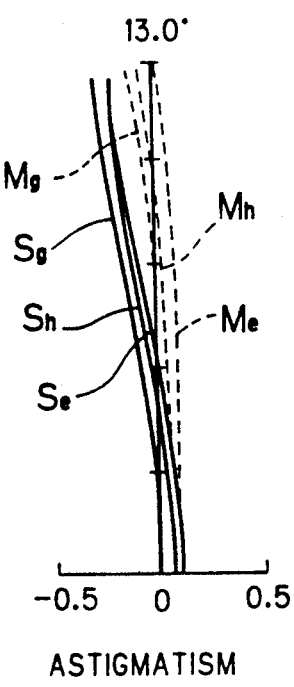
Figure 11D:
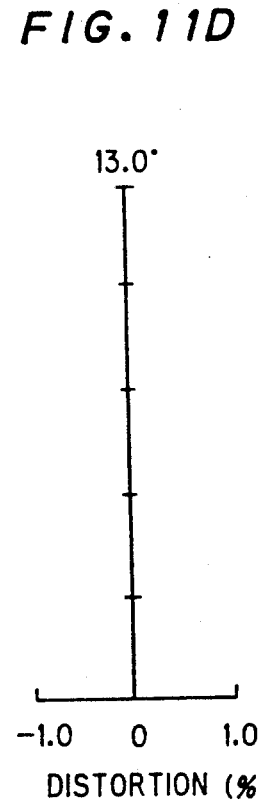

FIGS. 11B, 11C and 11D show spherical aberration, astigmatism and distortion of the lens system 11, respectively. It is found from FIG. 11B that the spherical aberrations with respect to the g-, h- and e-lines are small, that the curve configurations indicative thereof are approximate to each other, and that the average image points with respect to the h-, h- and e-lines substantially coincide with each other, for the lens system 11. It is found from FIG. 11C that the astigmatisms with respect to the g-, g- and e-lines are small, that the curve configurations indicative thereof are substantially similar to each other, and that the image fields with respect to the g-, h- and e-lines substantially coincide with each other within the range from the vicinity of the optical axis to the image peripheral portion.

(B-6) Other Preferred Embodiments

The lens systems according to the seventh to the eleventh preferred embodiments correct for chromatic aberration with respect to three wavelengths, i.e., the g-, h- and e-lines. Alternatively, the correction for chromatic aberration can be performed with respect to the combination of three arbitrary wavelengths.

C. Exposing Apparatus

Figure 13:
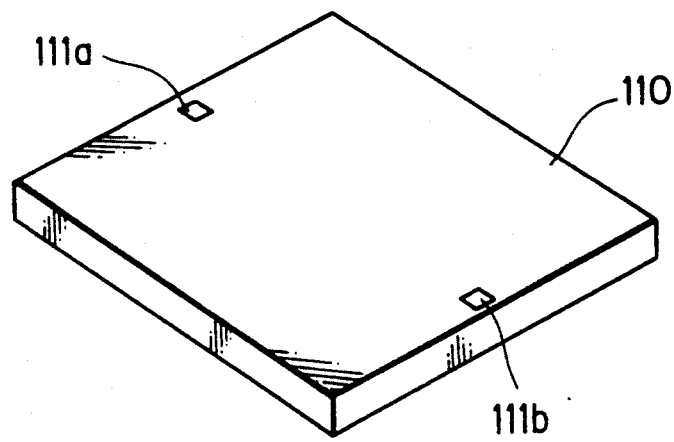
FIG. 13 is a perspective view of a photomask.
Figure 14:
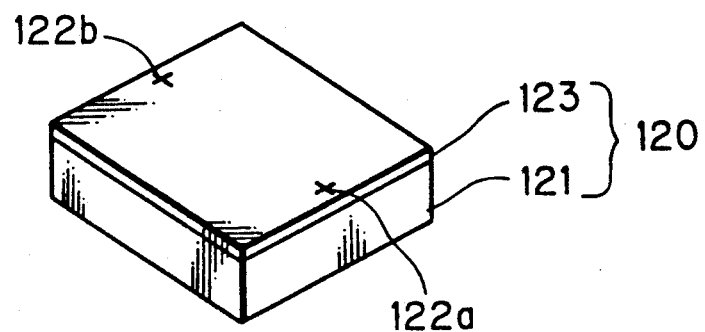
FIG. 14 is a perspective view of a semiconductor device.

FIGS. 12A and 12B are schematic diagrams of an exposing apparatus which employs the lens system according to the eleventh embodiment of the present invention. The exposing apparatus is used for transcribing a mask pattern of a photomask 110 of FIG. 13 on a semiconductor device 120 of FIG. 14. As can be seen in FIG. 13, marks 111a and 111b for aligning mask patterns are provided in prescribed positions on a surface of the photomask 110. In FIG. 14, cross marks 122a and 122b are provided on a substrate 121 of the semiconductor device 120 corresponding to the positions of the marks 111a and 111b. The semiconductor device 120 includes a photoresist layer 122.

As in FIG. 12A, the exposing apparatus includes an illumination unit 131a for emitting the e-line. Light radiations 132a of the e-line from the illumination unit 131a are reflected at a half mirror 134a provided in a housing 133, and lead to a projection lens system 135. The projection lens system 135 is identical in structure to the previously described lens system according to the eleventh embodiment.

Light radiations 136a of the e-line through the projection lens system 135 impinges near of the alignment mark 122a on a surface 121a of the substrate 121. Thus, the vicinity of the alignment mark 122a is illuminated. Light radiations 137a reflected from the substrate surface 121a are focused at the mark 111a placed on the photomask 110 through the projection lens system 135 and the half mirror 134a. Then, overlapped images of the mark 111a and the alignment mark 122a are received in a camera unit 139a.

The exposing apparatus also includes an illumination unit 131b for emitting the e-line. The exposing apparatus is designed as above so as to allow overlapped images of the mark 111b and the alignment mark 122b to be received in a camera unit 139b.

As in FIG. 12B, an illumination optical system 141 is provided above the photomask 110 to provide g- and h-lines radiation. The illumination optical system 141 emits light radiations 142 of the g- and h-lines, then light radiations 143 of the g- and h-lines transmitted through the photomask 110 irradiate a photoresist layer 123 through the projection lens system 135. As a result, a portion of the photoresist layer 123 which corresponds only to B pattern (not shown) formed on the photomask photochemically changes.

The illumination units 131a and 131b, the half mirrors 134a and 134b and the camera units 139a and 139b can be moved between the respective positions shown in FIG. 12A and positions where they do not intercept the light radiation from the illumination optical system 141. During aligning, accordingly, the illumination units 131a and 131b and the other units can be placed in prescribed positions in order to obtain overlapped images of marks of the photomask 110 and alignment marks of the substrate 121 (FIG. 12A). On the other hand in the exposing process, the illumination units 131a and 131b and the Other units are set back to prescribed withdrawn positions, in order to allow the g- and h-lines to irradiate the photoresist layer 123.

Figure 15:
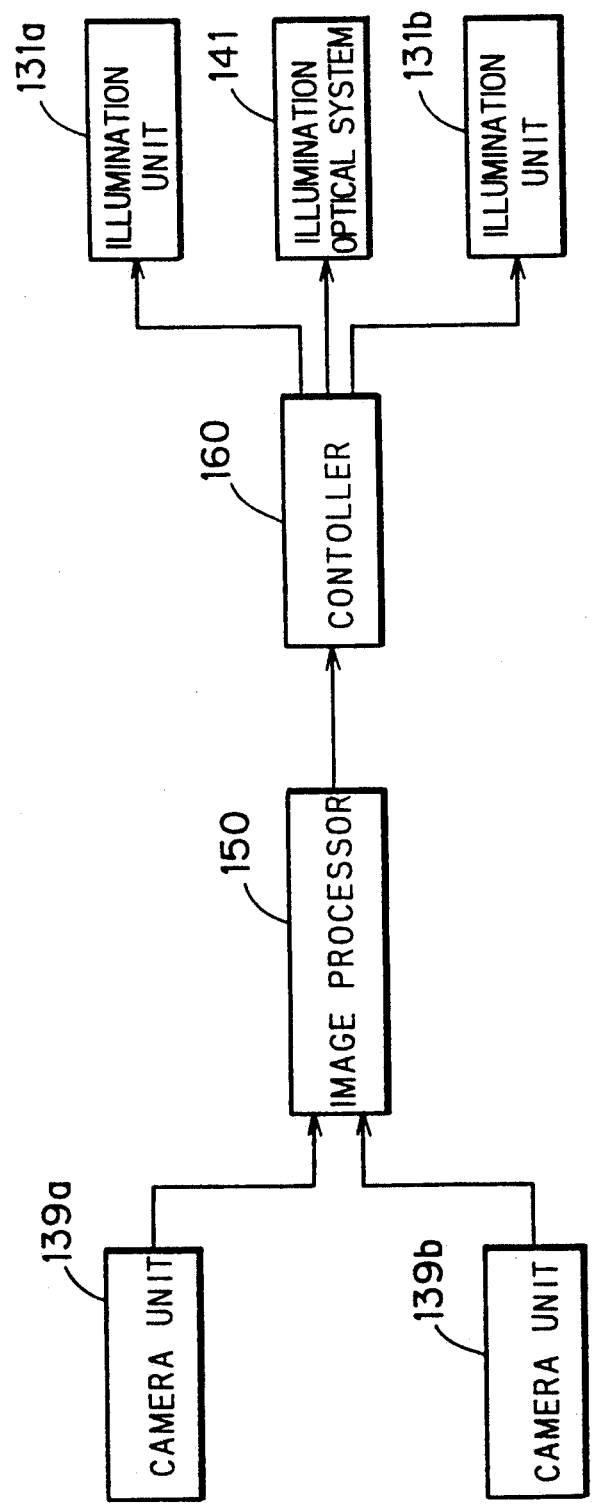
FIG. 15 is a block diagram of electric structure of the exposing apparatus.

FIG. 15 is a block diagram showing electrical structures of the exposing apparatus. As in the figure, image data obtained in the camera units 139a and 139b are supplied to an image processor 150, and are processed therein according to predetermined procedures. Processed image data are then provided to a controller 160. The controller 160, which is connected with respective units of the exposing apparatus e.g., the illumination units 139a and 139b and the illumination optical system 141, carries out aligning and exposing as described later while controlling the whole apparatus.

Figure 16:
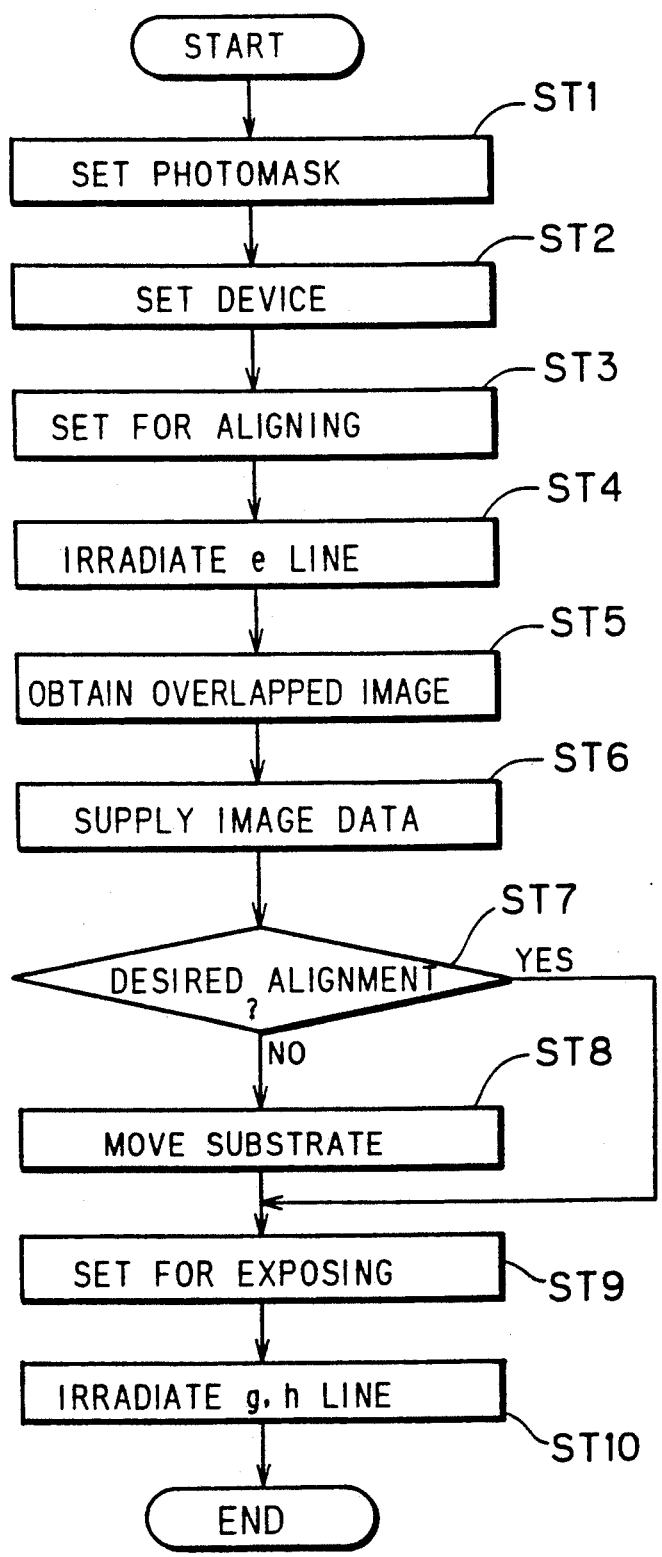
FIG. 16 is a flow chart of operations of the exposing apparatus.

FIG. 16 is a flow chart the operations of the exposing apparatus constructed as above. The photomask 110 is first set in a prescribed position (Step ST I), then the semiconductor device 120 to be exposed is next set in an exposing position (Step ST2). Responsive to an instruction given from the controller 160, the illumination units 131a and 131b, the half mirrors 134a and 134b and the camera units 139a and 139b are moved to the prescribed aligning positions shown in FIG. 12A (Step ST3). Thereafter, the illumination units 139a and 139b emit the e-line for illuminating the surface to be exposed, i.e., the surface 121a (Step ST4). Light radiations reflected at the exposing surface are focused at the marks 111a and 111b on the photomask 110. Then, overlapped images of the mark 111a with the alignment mark 122a and the mark 111b with the alignment mark 122b are obtained with the camera units 139a and 139b, respectively (Step ST5). Next, in Step ST6, the data of the overlapped images are supplied to the image processor 150, and are processed therein according to predetermined procedures. Then in Step ST7, it is judged whether or not the marks 111a and 111b and the alignment marks 122a and 122b are properly aligned, respectively. Step ST9 is then carried out if it is determined that the mark 111a and the alignment mark 122a are properly aligned to eaoh other as well as the mark 111b and the alignment mark 122b. On the other hand, if it is determined that the desired alignment of the marks and the alignment marks is not obtained, Step ST8 is carried out prior to Step ST9. In other words, the substrate 121 is moved until the marks 111a and 111b and the alignment marks 122a and 122b ar properly aligned, respectively.

The illumination units 131a and 131b, the half mirrors 134a and 134b and the camera units 139a and 139b are moved to the withdrawn positions in response to an instruction from the controller 160 in Step ST9. Thereafter in Step ST10, the illumination optical system 141 emits the e-line and h-line light, thus eventually irradiating the surface to be exposed, i.e., the surface 121a by the g- and h-lines. Thus, the pattern of the photomask 110 is transcribed onto the photoresist 123 for a short time.

Although the present invention has been described and illustrated in detail, it is to be clearly understood that the same is by way of illustration and example only and is not to be taken by way of limitation. The spirit and scope of the present invention should be limited only by the terms of the appended claims.

What is claimed is:

1. A lens system comprising:
    a stop;
    a front lens system disposed on one side of said stop and comprising three lens groups which include two meniscus lenses, each said meniscus lens having a negative power, and
    a rear lens system disposed on the other side of said stop and comprising three lens groups which include two meniscus lenses, each said meniscus lens having negative power, wherein
    each of said meniscus lenses as a concave surface directed to said stop and wherein each of said meniscus lenses is made of anomalous dispersion glass.

2. A lens system of claim 1, wherein said front lens system and said rear lens system are approximately symmetrical with respect to said stop.

3. A lens system for transferring an image of an object onto an image plane, said lens system comprising:
    a stop located between said object and said image plane;
    a front lens system disposed between said object and said stop and comprising a first lens group, a second lens group and a third lens group, said first to said third lens groups being successively disposed in order from said object to said stop; and
    a rear lens system disposed between said image plane and said stop and comprising a fourth lens group, a fifth lens group and a sixth lens group, said fourth to said sixth lens groups being successively disposed in order from said stop to said image plane wherein
    said front lens system includes a first meniscus lens having a negative power and a second meniscus lens having a negative power, and said rear lens system includes a third meniscus lens having a negative power and a fourth meniscus lens having a negative power, each of said meniscus lenses having a concave surface directed to said stop, each said first to said fourth meniscus lenses being made of anomalous dispersion glass.

4. A lens system of claim 3, wherein said third lens group includes said second meniscus lens, and said fourth lens group includes said third meniscus lens.

5. A lens system of claim 4, wherein said first lens group includes said first meniscus lens.

6. A lens system of claim 4, wherein said second lens group includes said first meniscus lens.

7. A lens system of claim 4, wherein said third lens group includes said first meniscus lens.

8. A lens system of claim 4, wherein said fourth lens group includes said fourth meniscus lens.

9. A lens system of claim 4, wherein said fifth lens group includes said fourth meniscus lens.

10. A lens system of claim 4, wherein said sixth lens group includes said fourth meniscus lens.

11. A lens system of claim 4, wherein said front lens system and said rear lens system are approximately symmetrical with respect to said stop.

12. A lens system of claim 11, wherein said third lens group includes said second meniscus lens, and said fourth lens group includes said fourth meniscus lens.

13. A lens system of claim 11, wherein said second lens group includes said second meniscus lens, and said fifth lens group includes said fourth meniscus lens.

14. A lens system of claim 11, wherein said first lens group includes said second meniscus lens, and said sixth lens group includes said fourth meniscus lens.

15. A lens system of claim 5, wherein said fourth lens group includes said fourth meniscus lens.

16. An apparatus for reproducing a mask pattern of a photomask onto a semiconductor substrate, said apparatus comprising:

means for irradiating said photomask with light having at least one short wavelength;

a lens system for imaging said mask pattern of said photomask on said semiconductor substrate;

means for illuminating said semiconductor substrate with light having a long wavelength; and means for receiving an overlapped image of said photomask and said semiconductor substrate through said lens system, thereby aligning said photomask and said semiconductor substrate with each other, wherein said lens system comprises:

a stop located between said photomask and said semiconductor substrate;

a front lens system disposed between said photomask and said stop and comprising a first lens group, a second lens group and a third lens group, said first to said third lens groups being successively disposed in order from said photomask to said stop; and a rear lens system disposed between said semiconductor substrate and said stop and comprising a fourth lens group, a fifth lens group and a sixth lens group, said fourth to said sixth lens groups being successively disposed in order from said stop to said semiconductor substrate wherein said front lens system includes a first meniscus lens having a negative power and a second meniscus lens having a negative power, and said rear lens system includes a third meniscus lens having a negative power and a fourth meniscus lens having a negative power, each of said meniscus lenses having a concave surface directed to said stop and each of said meniscus lens being made of anomalous dispersion glass material.

17. The apparatus of claim 16, wherein said third lens group includes said second meniscus lens, and said fourth lens group includes said third meniscus lens.

* * * * *